(12) United States Patent
Dhindsa et al.

(10) Patent No.: US 11,984,306 B2
(45) Date of Patent: May 14, 2024

(54) PLASMA CHAMBER AND CHAMBER COMPONENT CLEANING METHODS

(71) Applicant: Applied Materials, Inc., Santa Clara, CA (US)

(72) Inventors: Rajinder Dhindsa, Pleasanton, CA (US); Linying Cui, Cupertino, CA (US); James Rogers, Los Gatos, CA (US)

(73) Assignee: Applied Materials, Inc., Santa Clara, CA (US)

(*) Notice: Subject to any disclaimer, the term of this patent is extended or adjusted under 35 U.S.C. 154(b) by 70 days.

(21) Appl. No.: 17/562,467

(22) Filed: Dec. 27, 2021

(65) Prior Publication Data

US 2022/0399194 A1    Dec. 15, 2022

Related U.S. Application Data

(60) Provisional application No. 63/208,911, filed on Jun. 9, 2021.

(51) Int. Cl.
  *H01J 37/32*    (2006.01)
  *H01L 21/02*    (2006.01)

(52) U.S. Cl.
  CPC .. *H01J 37/32862* (2013.01); *H01J 37/32128* (2013.01); *H01J 37/32165* (2013.01); *H01J 37/32174* (2013.01); *H01J 37/32449* (2013.01); *H01J 37/32577* (2013.01); *H01L 21/02274* (2013.01)

(58) Field of Classification Search
  CPC ........... H01J 37/32862; H01J 37/32128; H01J 37/32165; H01J 37/32174; H01J 37/32449; H01J 37/32577; H01L 21/02274
  See application file for complete search history.

(56) References Cited

U.S. PATENT DOCUMENTS

| 4,070,589 | A | 1/1978 | Martinkovic |
| 4,340,462 | A | 7/1982 | Koch |
| 4,464,223 | A | 8/1984 | Gorin |

(Continued)

FOREIGN PATENT DOCUMENTS

| CN | 101707186 B | 2/2012 |
| CN | 106206234 A | 12/2016 |

(Continued)

OTHER PUBLICATIONS

International Search Report and Written Opinion from PCT/US2022/029791 dated Sep. 8, 2022.

(Continued)

*Primary Examiner* — Renan Luque
(74) *Attorney, Agent, or Firm* — Patterson + Sheridan, LLP

(57) ABSTRACT

Embodiments provided herein generally include plasma processing systems configured to preferentially clean desired surfaces of a substrate support assembly by manipulating one or more characteristics of an in-situ plasma and related methods. In one embodiment, a plasma processing method includes generating a plasma in a processing region defined by a chamber lid and a substrate support assembly, exposing an edge ring and a substrate supporting surface to the plasma, and establishing a pulsed voltage (PV) waveform at the edge control electrode.

20 Claims, 14 Drawing Sheets

(56) References Cited

U.S. PATENT DOCUMENTS

| | | |
|---|---|---|
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 7,016,620 B2 | 3/2006 | Maess et al. |
| 7,046,088 B2 | 5/2006 | Ziegler |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,312,974 B2 | 12/2007 | Kuchimachi |
| 7,415,940 B2 | 8/2008 | Koshimizu et al. |
| 7,479,712 B2 | 1/2009 | Richert et al. |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,133,347 B2 | 3/2012 | Gluck et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |

(56) References Cited

U.S. PATENT DOCUMENTS

| | | |
|---|---|---|
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,139,910 B2 | 9/2015 | Lee et al. |
| 9,147,555 B2 | 9/2015 | Richter |
| 9,150,960 B2 | 10/2015 | Nauman et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,228,878 B2 | 1/2016 | Haw et al. |
| 9,254,168 B2 | 2/2016 | Palanker |
| 9,287,086 B2 | 3/2016 | Brouk et al. |
| 9,287,092 B2 | 3/2016 | Brouk et al. |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,564,287 B2 | 2/2017 | Ohse et al. |
| 9,576,810 B2 | 2/2017 | Deshmukh et al. |
| 9,576,816 B2 | 2/2017 | Rastogi et al. |
| 9,593,421 B2 | 3/2017 | Baek et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,728,429 B2 | 8/2017 | Ricci et al. |
| 9,741,544 B2 | 8/2017 | Van Zyl |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,840,770 B2 | 12/2017 | Klimczak et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,872,373 B1 | 1/2018 | Shimizu et al. |
| 9,881,820 B2 | 1/2018 | Wong et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,960,763 B2 | 5/2018 | Miller et al. |
| 9,972,503 B2 | 5/2018 | Tomura et al. |
| 10,020,800 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,387,166 B2 | 8/2019 | Preston et al. |
| 10,388,544 B2 | 8/2019 | Ui et al. |
| 10,410,877 B2 | 9/2019 | Takashima et al. |
| 10,431,437 B2 | 10/2019 | Gapi 70ndki et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,460,910 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,546,728 B2 | 1/2020 | Carducci et al. |
| 10,553,407 B2 | 2/2020 | Nagami et al. |

(56) References Cited

U.S. PATENT DOCUMENTS

| | | |
|---|---|---|
| 10,555,412 B2 | 2/2020 | Dorf et al. |
| 10,593,519 B2 | 3/2020 | Yamada et al. |
| 10,607,814 B2 | 3/2020 | Ziemba et al. |
| 10,658,189 B2 | 5/2020 | Hatazaki et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,714,372 B2 | 7/2020 | Chua et al. |
| 10,720,305 B2 | 7/2020 | Van Zyl |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,790,816 B2 | 9/2020 | Ziemba et al. |
| 10,796,887 B2 | 10/2020 | Prager et al. |
| 10,804,886 B2 | 10/2020 | Miller et al. |
| 10,811,296 B2 | 10/2020 | Cho et al. |
| 10,892,141 B2 | 1/2021 | Ziemba et al. |
| 10,896,807 B2 | 1/2021 | Fairbairn et al. |
| 10,903,047 B2 | 1/2021 | Ziemba et al. |
| 10,904,996 B2 | 1/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,108,384 B2 | 8/2021 | Prager et al. |
| 2001/0003298 A1 | 6/2001 | Shamouilian et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0079385 A1 | 4/2004 | Frisa et al. |
| 2004/0223284 A1 | 11/2004 | Iwami et al. |
| 2005/0022933 A1 | 2/2005 | Howard |
| 2005/0092596 A1 | 5/2005 | Kouznetsov |
| 2005/0152159 A1 | 7/2005 | Isurin et al. |
| 2005/0286916 A1 | 12/2005 | Nakazato et al. |
| 2006/0037700 A1 | 2/2006 | Shi et al. |
| 2006/0075969 A1 | 4/2006 | Fischer |
| 2006/0130767 A1 | 6/2006 | Herchen |
| 2006/0139843 A1 | 6/2006 | Kim |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2008/0012548 A1 | 1/2008 | Gerhardt et al. |
| 2008/0037196 A1 | 2/2008 | Yonekura et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0237185 A1 | 10/2008 | Ui et al. |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0078678 A1 | 3/2009 | Kojima et al. |
| 2009/0133839 A1 | 5/2009 | Yamazawa et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0101935 A1 | 4/2010 | Chistyakov et al. |
| 2010/0118464 A1 | 5/2010 | Matsuyama |
| 2010/0193491 A1 | 8/2010 | Cho et al. |
| 2010/0271744 A1 | 10/2010 | Ni et al. |
| 2010/0326957 A1 | 12/2010 | Maeda et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2013/0059448 A1 | 3/2013 | Marakhtanov et al. |
| 2013/0087447 A1 | 4/2013 | Bodke et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0077611 A1 | 3/2014 | Young et al. |
| 2014/0103027 A1* | 4/2014 | Miller ............... H01L 21/67103 |
| | | 219/444.1 |
| 2014/0109886 A1 | 4/2014 | Singleton et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0263182 A1 | 9/2014 | Chen et al. |
| 2014/0273487 A1 | 9/2014 | Deshmukh et al. |
| 2015/0002018 A1 | 1/2015 | Lill et al. |
| 2015/0043123 A1 | 2/2015 | Cox |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0170952 A1 | 6/2015 | Subramani et al. |
| 2015/0235809 A1 | 8/2015 | Ito et al. |
| 2015/0315698 A1 | 11/2015 | Chistyakov |
| 2015/0366004 A1 | 12/2015 | Nangoy et al. |
| 2016/0004475 A1 | 1/2016 | Beniyama et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0241234 A1 | 8/2016 | Mavretic |
| 2016/0284514 A1 | 9/2016 | Hirano et al. |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0115657 A1 | 4/2017 | Trussell et al. |
| 2017/0162417 A1 | 6/2017 | Ye et al. |

(56) References Cited

U.S. PATENT DOCUMENTS

| | | |
|---|---|---|
| 2017/0169996 A1 | 6/2017 | Ui et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2018/0076032 A1 | 3/2018 | Wang et al. |
| 2018/0139834 A1 | 5/2018 | Nagashima et al. |
| 2018/0190501 A1 | 7/2018 | Ueda |
| 2018/0204708 A1 | 7/2018 | Tan et al. |
| 2018/0218905 A1 | 8/2018 | Park et al. |
| 2018/0226896 A1 | 8/2018 | Miller et al. |
| 2018/0294566 A1 | 10/2018 | Wang et al. |
| 2018/0309423 A1 | 10/2018 | Okunishi et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0013184 A1* | 1/2019 | Cui .................. H01J 37/32642 |
| 2019/0027344 A1 | 1/2019 | Okunishi et al. |
| 2019/0096633 A1 | 3/2019 | Pankratz et al. |
| 2019/0157042 A1 | 5/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0267218 A1 | 8/2019 | Wang et al. |
| 2019/0277804 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0051785 A1 | 2/2020 | Miller et al. |
| 2020/0058475 A1 | 2/2020 | Engelstaedter et al. |
| 2020/0066497 A1 | 2/2020 | Engelstaedter et al. |
| 2020/0075293 A1 | 3/2020 | Ventzek et al. |
| 2020/0106137 A1 | 4/2020 | Murphy et al. |
| 2020/0126837 A1 | 4/2020 | Kuno et al. |
| 2020/0144030 A1 | 5/2020 | Prager et al. |
| 2020/0161098 A1 | 5/2020 | Cui et al. |
| 2020/0161155 A1 | 5/2020 | Rogers et al. |
| 2020/0227230 A1 | 7/2020 | Ziemba et al. |
| 2020/0243303 A1 | 7/2020 | Mishra et al. |
| 2020/0251371 A1 | 8/2020 | Kuno et al. |
| 2020/0266035 A1 | 8/2020 | Nagaiwa |
| 2020/0357607 A1 | 11/2020 | Ziemba et al. |
| 2020/0373114 A1 | 11/2020 | Prager et al. |
| 2020/0407840 A1 | 12/2020 | Hayashi et al. |
| 2020/0411286 A1 | 12/2020 | Koshimizu et al. |
| 2021/0013006 A1 | 1/2021 | Nguyen et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0130955 A1 | 5/2021 | Nagaike et al. |
| 2021/0134561 A1 | 5/2021 | Koh et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0249227 A1 | 8/2021 | Bowman et al. |
| 2021/0272782 A1 | 9/2021 | Koshimizu |

FOREIGN PATENT DOCUMENTS

| | | |
|---|---|---|
| CN | 104752134 B | 2/2017 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |
| JP | 6741461 B2 | 8/2020 |
| WO | 2000017920 A1 | 3/2000 |
| WO | 2002059954 A1 | 8/2002 |
| WO | 2008050619 A1 | 5/2008 |
| WO | 2014124857 A3 | 5/2015 |
| WO | 2015198854 A1 | 12/2015 |
| WO | 2016002547 A1 | 1/2016 |
| WO | 2016131061 A1 | 8/2016 |
| WO | 2016151970 A1 | 9/2016 |
| WO | 2019036587 A1 | 2/2019 |
| WO | 2019185423 A1 | 10/2019 |
| WO | 2019225184 A1 | 11/2019 |
| WO | 2019239872 A1 | 12/2019 |
| WO | 2019245729 A1 | 12/2019 |
| WO | 2020004048 A1 | 1/2020 |
| WO | 2020017328 A1 | 1/2020 |
| WO | 2020051064 A1 | 3/2020 |
| WO | 2020121819 A1 | 6/2020 |
| WO | 2021021531 A1 | 2/2021 |
| WO | 2022108754 A1 | 5/2022 |

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies presentation by Dr. Kenneth E. Miller—"The EHT Long Pulse Integrator Program," ITPA Diagnostic Meeting, General Atomics, Jun. 4-7, 2013, 18 pages.

Eagle Harbor Technologies webpage—"In Situ Testing of EHT Integrators on a Tokamak," 2015, 1 page.

Eagle Harbor Technologies webpage—High Gain and Frequency Ultra-Stable Integrators for Long Pulse and/or High Current Applications, 2018, 1 page.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—"Long-Pulse Integrator Testing with DIII-D Magnetic Diagnostics," 2016, 1 page.

Sunstone Circuits—"Eagle Harbor Tech Case Study," date unknown, 4 pages.

Electrical 4 U webpage—"Clamping Circuit," Aug. 29, 2018, 9 pages.

Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.

Lin, Jianliang, et al.,—"Diamond like carbon films deposited by HiPIMS using oscillatory voltage pulses," Surface & Coatings Technology 258, 2014, published by Elsevier B.V., pp. 1212-1222.

Semiconductor Components Industries, LLC (SCILLC)—"Switch-Mode Power Supply" Reference Manual, SMPSRM/D, Rev. 4, Apr. 2014, ON Semiconductor, 73 pages.

Prager, J.R. et al, A High Voltage Nanosecond Pulser With Variable Pulse Width and Pulse Repetition Frequency Control for Nonequilibrium Plasma Applications, IEEE 2014, 6 pages.

(56) References Cited

OTHER PUBLICATIONS

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

S.B. Wang et al. "Ion Bombardment Energy and SiO 2/Si Fluorocarbon Plasma Etch Selectivity", Journal of Vacuum Science & Technology A 19, 2425 (2001).

Zhen-hua Bi et al., A brief review of dual-frequency capacitively coupled discharges, Current Applied Physics, vol. 11, Issue 5, Supplement, 2011, pp. S2-S8.

Chang, Bingdong, "Oblique angled plasma etching for 3D silicon structures with wiggling geometries" 31(8), [085301]. https://doi.org/10.1088/1361-6528/ab53fb. DTU Library. 2019.

Michael A. Lieberman, "A short course of the principles of plasma discharges and materials processing", Department of Electrical Engineering and Computer Sciences University of California, Berkeley, CA 94720.

Dr. Steve Sirard, "Introduction to Plasma Etching", Lam Research Corporation. 64 pages.

Zhuoxing Luo, B.S., M.S, "RF Plasma Etching With a DC Bias" A Dissertation in Physics. Dec. 1994.

Michael A. Lieberman, "Principles of Plasma Discharges and Material Processing", A Wiley Interscience Publication. 1994.

Yiting Zhang et al. "Investigation of feature orientation and consequences of ion tilting during plasma etching with a three-dimensional feature profile simulator", Nov. 22, 2016.

Richard Barnett et al. A New Plasma Source for Next Generation MEMS Deep Si Etching: Minimal Tilt, Improved Profile Uniformity and Higher Etch Rates, SPP Process Technology Systems. 2010.

* cited by examiner

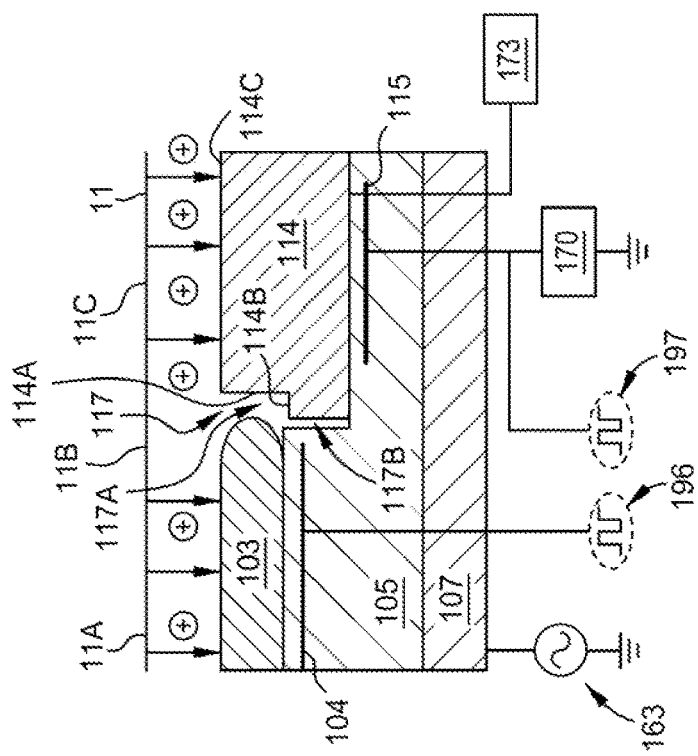
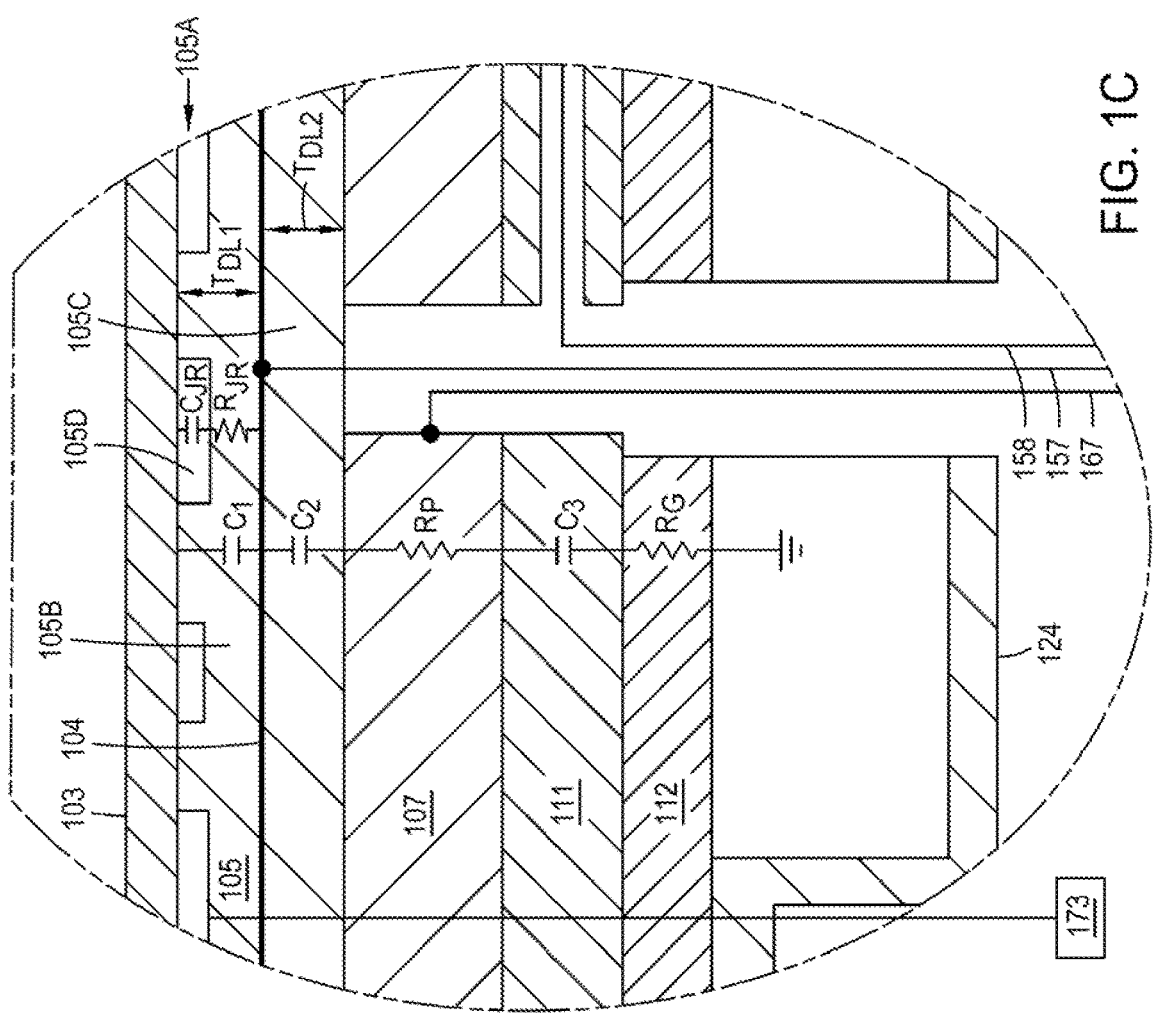
FIG. 1D
FIG. 1C

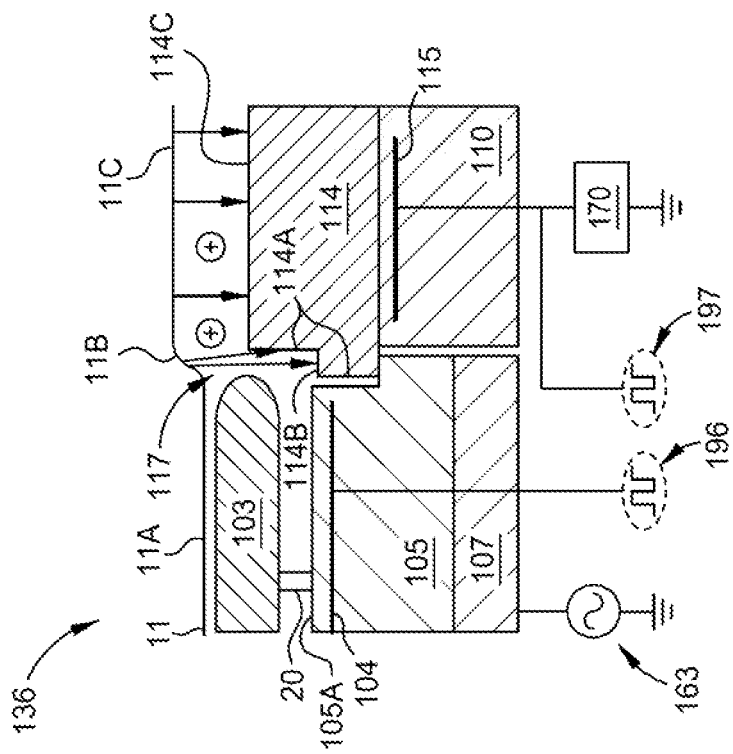
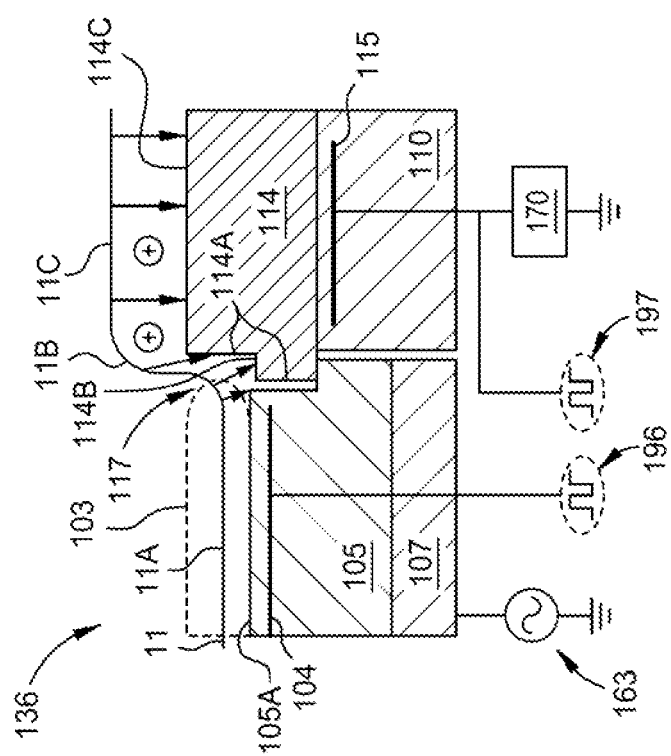

PLASMA CHAMBER AND CHAMBER COMPONENT CLEANING METHODS

CROSS-REFERENCE TO RELATED APPLICATIONS

This application claims the benefit of U.S. Provisional Application 63/208,911 filed on Jun. 9, 2021.

BACKGROUND

Field

Embodiments herein are directed to plasma-generating gas or vapor electric space discharge devices used in semiconductor device manufacturing, particularly processing chambers configured to generate a capacitively coupled or inductively coupled plasma of gas or vapor material supplied to a chamber volume and process a semiconductor substrate therein.

Description of the Related Art

Electrostatic chucks (ESC) are commonly used in semiconductor device manufacturing operations where vacuum chucking is not feasible, and mechanical clamping is undesirable, such as supporting and securing a substrate in a low-pressure environment of a processing chamber. A typical ESC is formed of one or more layers of dielectric material that provide a surface for supporting the substrate (e.g., a substrate-support surface) and further includes a chucking electrode embedded in or disposed between the one or more layers of dielectric material. The substrate is secured to the ESC by providing a voltage potential difference between the substrate and the chucking electrode that results in an electrostatic attraction force therebetween.

Often, the ESC is part of an assembly configured to control aspects of a plasma-assisted process performed within the processing chamber, such as a plasma-assisted etching process that uses ions to bombard a material surface of a substrate through openings in a mask layer formed on the substrate surface. In a typical plasma-assisted etching process, the substrate is positioned on the ESC, a plasma is formed over the substrate, and ions are accelerated from the plasma towards the substrate across a plasma sheath, i.e., a region depleted of electrons that formed between the plasma and the surface of the substrate.

The ESC assembly may include an edge ring that is used to improve plasma processing non-uniformity near the edge of the substrate by reducing electrical and thermal discontinuities between the edge of the substrate and the portions of the ESC assembly that are outwardly disposed from the edge of the substrate. Typically, the edge ring is positioned to surround the substrate and is sized to allow at least some tolerance for positioning the substrate on the ESC so that the inward-facing surface of the edge ring and the peripheral edge of the substrate define a gap region therebetween.

Commonly, processing byproducts from plasma-assisted processes will accumulate on chamber surfaces, including surfaces of the ESC assembly. Conventional methods of cleaning such byproducts include exposing the chamber surfaces to the activated species of a cleaning gas, which may be formed using a remote plasma source and flowed into the processing chamber or may be formed by flowing the cleaning gas into the chamber and forming an in-situ plasma therein. The activated species of the cleaning gas react with processing byproducts formed on chamber surfaces to form a volatile species that is evacuated from the processing chamber through an exhaust. Typically, it is best to minimize the number and/or duration of chamber cleaning processes due to associated downtime and surface damage to chamber components caused by repeated exposure to the activated cleaning gas.

Unfortunately, undesired processing byproducts often accumulate in portions of the ESC assembly, such as in a gap between the peripheral edge of the substrate and the inward-facing portions of the edge ring, long before a chamber cleaning process is needed for the other processing components disposed therein. The processing byproducts accumulated in the gap may transfer to the bevel edge of the substrate and/or may cause plasma instabilities that result in undesired arcing between the substrate and the edge ring. Surface defectivity from transferred processing byproducts and/or arcing-related damage at the substrate edge can result in reliability problems or failure of devices formed on the substrate, thus suppressing the yield of usable devices formed thereon. Arcing-induced particles can also increase chamber contamination requiring increased chamber downtime for cleaning and maintenance, thus reducing system availability and production capacity. Frequent use of conventional chamber cleaning methods to clean the gap portion of the ESC also reduces system availability and reduces production capacity and has the added problem of potentially damaging other surfaces of the ESC, such as the substrate-supporting surface, and reducing the useful lifetime thereof.

Accordingly, what is needed in the art are systems and methods that solve the problems described above.

SUMMARY

Embodiments provided herein generally include plasma processing systems configured to preferentially clean desired surfaces of a substrate support assembly by manipulating one or more characteristics of an in-situ plasma and related methods.

In one embodiment, a plasma processing method includes (a) generating a plasma in a processing region defined by a chamber lid and a substrate support assembly, the substrate support assembly may include: a first portion of dielectric material that forms a substrate supporting surface; an edge ring surrounding the substrate supporting surface, the edge ring may include a plasma-facing surface and one or more edge pocket surfaces inwardly disposed from the plasma-facing surface; a bias electrode that is spaced apart from the substrate supporting surface by the first portion of dielectric material; and an edge control electrode that is disposed a distance from the center of the bias electrode, where the bias electrode is electrically coupled to a first bias generator configured to establish a first pulsed voltage (PV) waveform at the bias electrode; the edge control electrode is electrically coupled to a second bias generator configured to establish a second pulsed voltage (PV) waveform at the edge control electrode; (b) exposing the edge ring and the substrate supporting surface to the plasma; and (c) concurrent with (b), establishing the second pulsed voltage (PV) waveform at the edge control electrode.

In another embodiment, a plasma processing method includes (a) igniting and maintaining a plasma in a processing region of a processing chamber, the plasma may include a first portion disposed between a substrate supporting surface of a substrate support assembly and a chamber lid and a second portion disposed between an edge ring and the chamber lid, the substrate support assembly may include: a first portion of dielectric material that forms the substrate supporting surface; a bias electrode that is spaced apart from the substrate supporting surface by the first portion of dielectric material, where the bias electrode is electrically coupled to a first pulsed voltage waveform generator configured to establish a first pulsed voltage (PV) waveform at the bias electrode; an edge control electrode that is disposed a distance from the center of the bias electrode, where the edge control electrode is electrically coupled to a second pulsed voltage (PV) waveform generator; and the edge ring that surrounds the substrate supporting surface, the edge ring may include one or more edge pocket surfaces that define an edge pocket region with an at least partially lifted substrate disposed over the substrate supporting surface; (b) establishing, using the second pulse voltage (PV) waveform generator, a second pulsed voltage (PV) waveform at the edge control electrode; and (c) exposing the at least partially lifted substrate to the plasma.

In another embodiment, a processing method includes (a) igniting and maintaining a plasma from gases or vapors delivered to a processing region, the processing region defined by a chamber lid and a substrate support assembly that faces the chamber lid, the substrate support assembly may include: a first portion of dielectric material that forms a substrate supporting surface; a first electrode spaced apart from the substrate supporting surface by the first portion of dielectric material; an edge ring that surrounds the substrate supporting surface, the edge ring having one or more edge pocket surfaces that define an edge pocket region with a circumferential edge of a partially lifted substrate disposed over the substrate supporting surface; and a second electrode spaced apart from the edge ring by a second portion of dielectric material, where the substrate support assembly is electrically coupled to a radio frequency (RF) generator that delivers an RF signal used to ignite and maintain the plasma, the RF signal establishes a first RF waveform at the first electrode and a second RF waveform at the second electrode, the second electrode is electrically coupled to an edge tuning circuit that is configured to adjust one or more characteristics of the second RF waveform relative to the first RF waveform to control a plasma density uniformity in the processing region, and at least one characteristic of the second RF waveform is different from a characteristic of the first RF waveform; and (b) exposing the one or more edge pocket surfaces to the plasma.

In another embodiment, a plasma chamber includes a chamber body and a chamber lid that define a processing volume; a substrate support assembly disposed in the processing volume to face the chamber lid, the substrate support assembly may include: a support base; and a substrate support disposed on the support base, the substrate support may include a dielectric material that forms a substrate supporting surface, a bias electrode that is disposed in the dielectric material and is spaced apart from the substrate supporting surface and the support base by portions of the dielectric material, and an edge control electrode that is spaced a distance from a center of the bias electrode. The chamber also includes an edge tuning circuit electrically coupled to the edge control electrode; and a non-transitory computer-readable medium having instructions for performing a method, the method may include: a) generating, by use of a radio frequency (RF) signal delivered to the support base, a plasma from gases or vapors delivered to the processing volume, where the RF signal is delivered to the support base by an RF generator, and the RF signal establishes a first RF waveform at the bias electrode and a second RF waveform at the edge control electrode; and b) adjusting, by use of the edge tuning circuit, one or more characteristics of the second RF waveform relative to the first RF waveform.

Other embodiments may include corresponding computer systems, apparatus, and computer programs recorded on one or more computer storage devices, each configured to perform the actions of the methods.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

FIGS. 1C-1D are close-up schematic cross-sectional views of portions of the substrate support assembly illustrated in FIG. 1A, according to one embodiment.

FIGS. 8A-8C are schematic sectional views of edge portions of substrate support assemblies, according to embodiments herein, which illustrate aspects of the methods set forth in FIGS. 7A-7C.

DETAILED DESCRIPTION

Figure 1A:
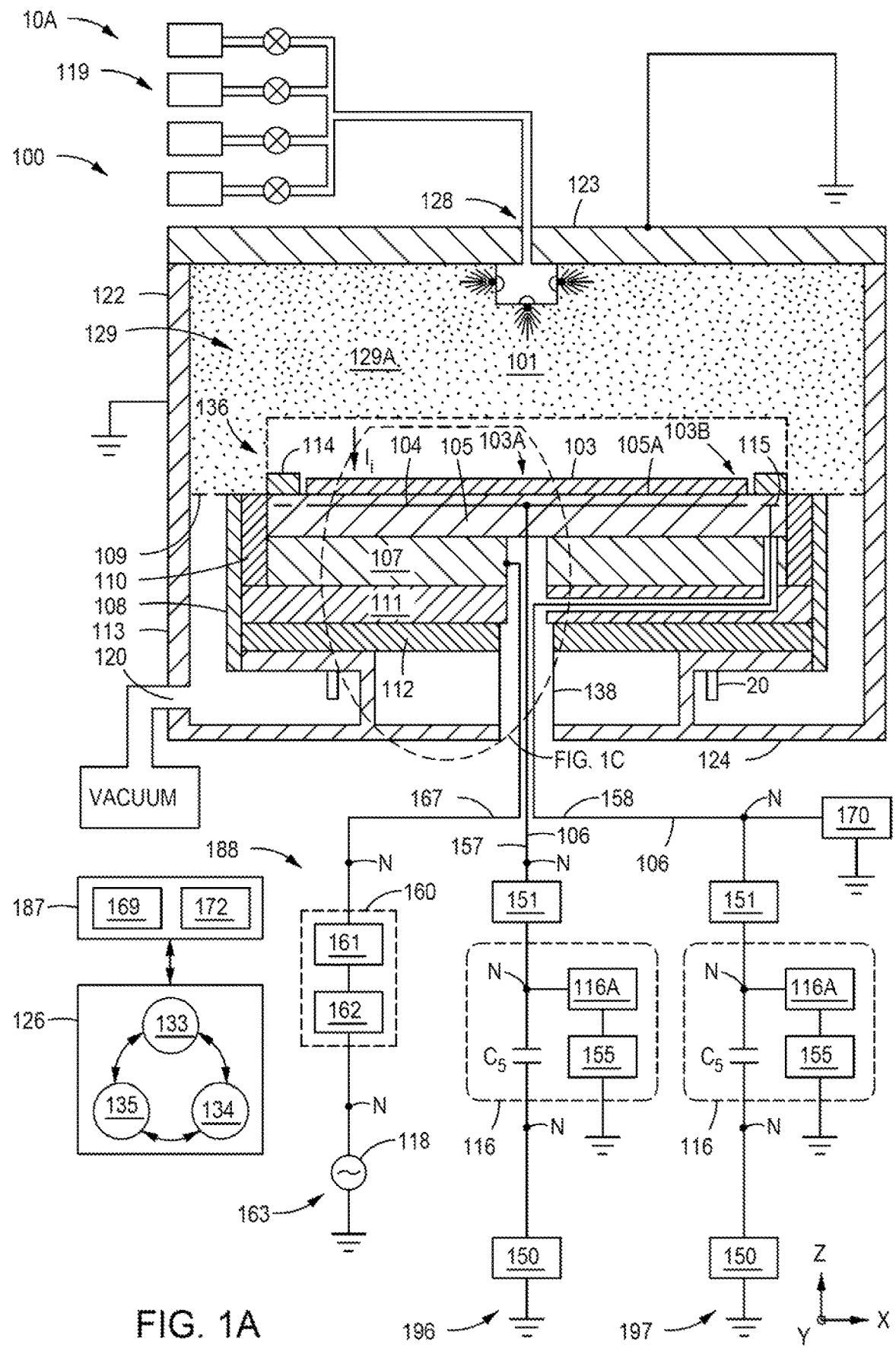
FIG. 1A-1B are schematic cross-sectional views of processing systems, according to one or more embodiments, configured to practice the methods set forth herein.

Embodiments provided herein are directed to processing systems used in a semiconductor device manufacturing process and methods related thereto. In particular, embodiments herein provide for the cleaning of portions of a substrate support assembly using a plasma formed in a processing chamber, such as an in-situ cleaning plasma. For example, in some embodiments, the systems and methods are used preferentially to clean accumulated processing byproducts from the portions of a substrate support assembly that define a gap region that is formed when a substrate is disposed on the substrate support assembly. Thus, the methods described herein may be used to beneficially in-situ plasma clean the gap region surfaces of the substrate support assembly while simultaneously reducing plasma damage to other surfaces, such as the substrate supporting surfaces that might extend the useful lifetime thereof.

In some embodiments, the processing system is configured for a plasma-assisted etch process where plasma-generated ions are used to bombard a material surface of the substrate through openings formed in a patterned mask layer formed on the substrate surface. In a typical plasma-assisted etching process, the substrate is positioned on a substrate receiving surface of the substrate support assembly, a plasma is formed over the substrate using a radio frequency (RF) power, and ions are accelerated from the plasma towards the substrate across a plasma sheath. The plasma sheath generally exhibits non-linear diode-like properties, which result in rectification of the applied RF field, such that a DC voltage drop, or self-bias, appears between the substrate and the plasma.

In some embodiments, the processing system is configured to control properties of the plasma sheath using a pulsed-voltage (PV) waveform delivered from one or more pulsed-voltage (PV) generators to the bias and edge control electrodes. In some embodiments, a radio frequency (RF) generated RF waveform is provided from an RF generator to one or more power electrodes within the processing chamber to establish and maintain the plasma within the processing chamber, while PV waveform(s) delivered from the one or more PV generators are configured to establish a nearly constant sheath voltage (e.g., a constant difference between the plasma potential and the substrate potential) across the surface of the substrate and surfaces of the substrate support assembly adjacent thereto. The established nearly constant sheath voltage provides a desirable ion energy distribution function (IEDF) at the surface of the substrate during the one or more plasma processing operations performed within the processing chamber.

Some embodiments of the disclosure include an apparatus and method for controlling plasma uniformity, e.g., by controlling electron density in the bulk plasma over the circumferential edge region of the substrate and adjacent surfaces of the substrate support assembly relative to the center of the substrate. In some embodiments, the plasma uniformity is controlled using an edge tuning circuit to control one or a combination of a voltage amplitude ratio between an RF waveform established at the edge control electrode and an RF waveform established at the bias electrode (e.g., chucking electrode), a current amplitude ratio between the RF waveforms at the edge control electrode and the bias electrode, and a phase difference between the RF waveforms at the respective electrodes.

In some embodiments, the ion energy and directionality are controlled by separately biasing the substrate and an edge ring that surrounds the substrate using pulsed voltage (PV) waveforms. The PV waveforms may be established at electrodes that form a portion of the substrate support assembly and are generally located in portions of the substrate support assembly that are positioned below the substrate (bias electrode) and the edge ring (edge control electrode), respectively. As described below, the PV waveforms can be used to manipulate the shape of a plasma sheath boundary to focus ions accelerated across the sheath towards desired regions of the surfaces there below. In some embodiments, a chamber component cleaning method uses the focused ions to target the gap region between the edge of the substrate and/or the substrate support surface and a surrounding edge ring to remove undesirable processing byproducts therefrom, such as polymers formed on surfaces of an edge pocket region during a reactive ion etch (RIE) plasma process.

In some embodiments, the ion flux (plasma density uniformity) is controlled by using an edge tuning circuit to adjust one or more characteristics of an RF waveform established at the edge control electrode relative to one or more characteristics of an RF waveform established at the bias electrode. For example, the edge tuning circuit can be used to adjust a voltage amplitude ratio or a current amplitude ratio between the RF waveforms established at the edge control electrode and the bias electrode. The voltage and/or current amplitude ratios can be used to adjust the distribution of plasma (plasma density) over the substrate support assembly so as to increase the density of the plasma over the edge ring relative to the density of the plasma over the center region of the substrate support assembly or vice versa.

In some embodiments, the edge tuning circuit is used to provide a desired phase difference between the RF waveforms established at the bias electrode and the edge control electrode. The phase difference can be adjusted to amplify an electric field generated between the two electrodes. The amplification of the electric field can be manipulated to increase the concentration of ions and reactive neutral species in a gap region disposed between the edge of the substrate and the inward-facing surface of the edge ring. In some embodiments, the phase difference between the RF waveforms is controlled to concentrate a plasma between the bias electrode and the edge control electrode, thus concentrating the plasma in the gap region.

In some embodiments, the pulsed voltage (PV) waveforms and/or the edge tuning circuit are used alone or in combination with substrate de-chucking methods to preferentially clean the gap region while concurrently protecting the dielectric substrate-supporting surface from ion-induced damage. For example, in some embodiments, the methods include focusing ions towards the gap region and/or concentrating the plasma in the gap region while a substrate is partially lifted from the substrate-supporting surface.

Beneficially, the apparatus and methods may be used alone or in combination to provide individual process tuning knobs for controlling ion energy and directionality uniformity, and separately controlling ion flux and/or reactive neutral species uniformity across the surfaces of the substrate support assembly and/or a substrate disposed thereon. For example, in some embodiments, ion energy, and directionality uniformity may be controlled by adjusting PV waveforms established at the edge control electrode and the bias electrode, respectively, so to control the thickness profile of the plasma sheath and the shape of a sheath boundary (between the plasma sheath and the plasma) formed over the gap regions of the substrate support assembly. Ion flux and/or reactive neutral species concentration uniformity may be separately controlled by adjusting the RF waveforms established at the respective electrodes. Thus, the apparatus and methods described herein facilitate targeted cleaning of the gap region of the substrate support assembly by controlling the ion energy, ion directionality, and/or concentration of ions and reactive neutral species there toward. An exemplary processing system that may be used to perform the methods is described in FIGS. 1A-1D.

Plasma Processing System Examples

Figure 1B:
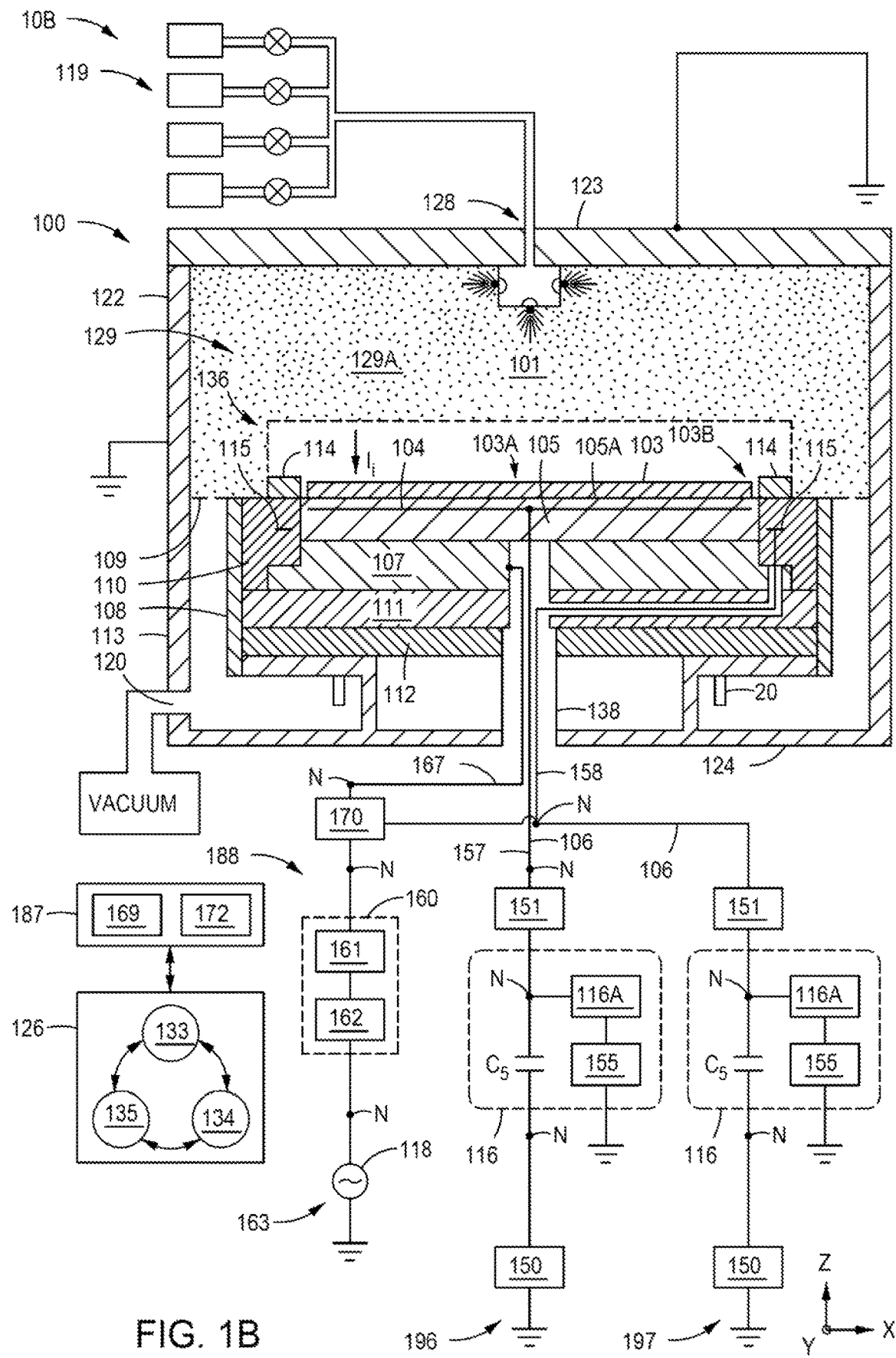
Figure 2:
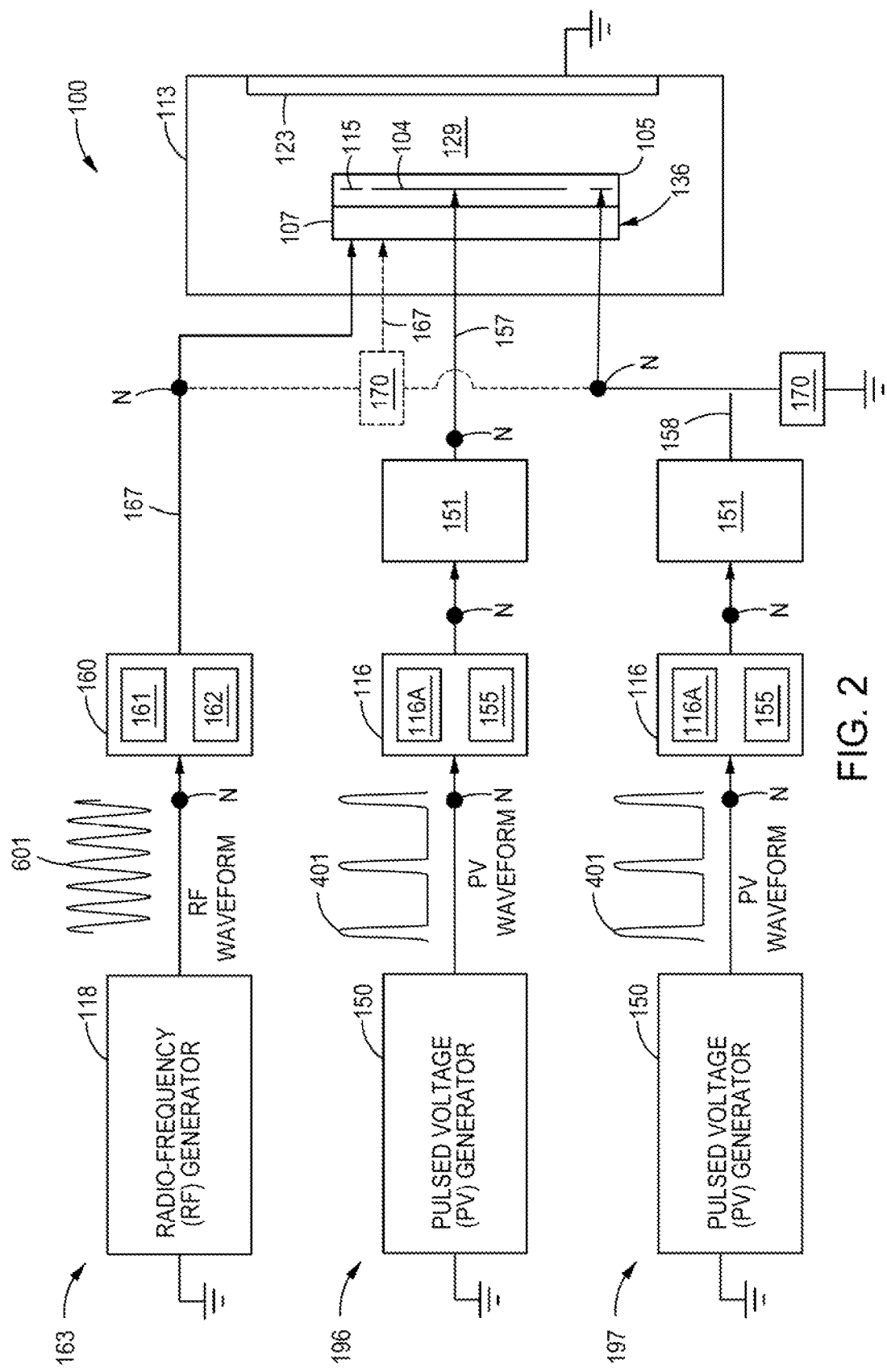
FIG. 2 is a simplified schematic diagram of a biasing and edge control scheme that can be used with one or both of the processing systems illustrated in FIGS. 1A-1B, according to one or more embodiments.
Figure 3B:
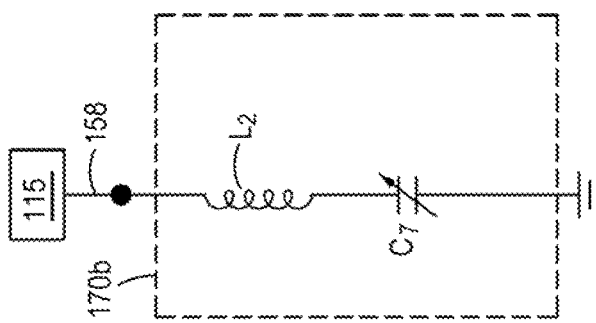
FIGS. 3A-3C schematically illustrate example edge tuning circuits that can be used with one or both of the processing systems illustrated in FIGS. 1A-1B, according to one or more embodiments.
Figure 3C:
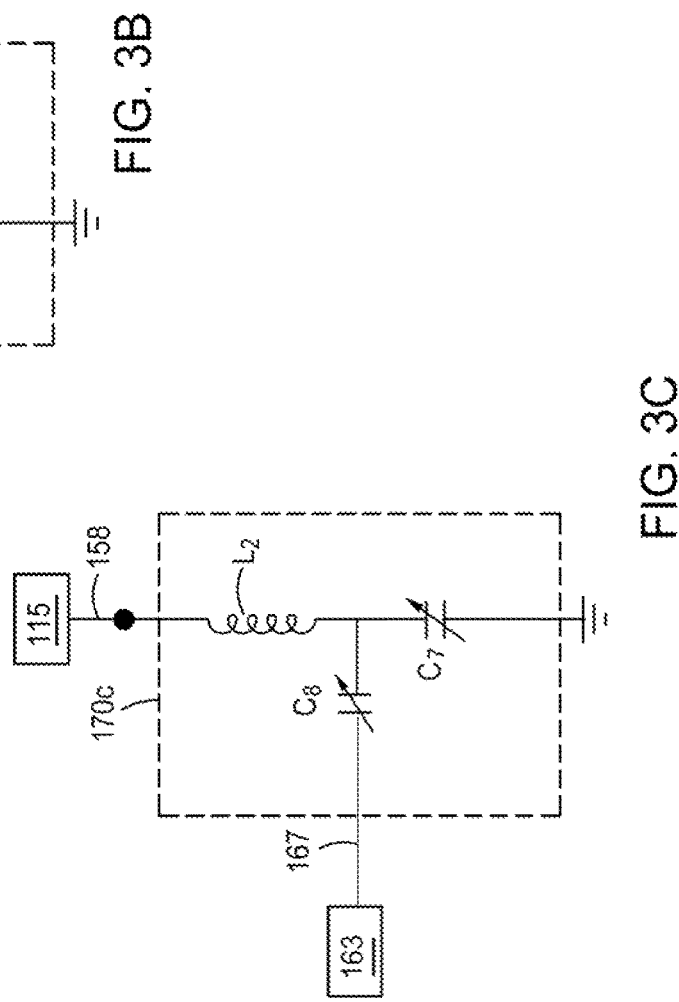
Figure 3A:
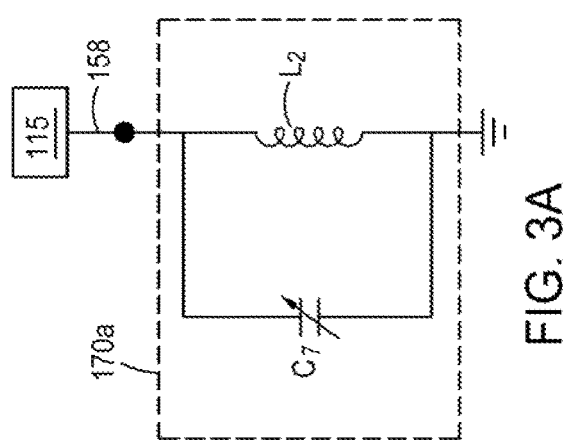

FIGS. 1A and 1B are schematic cross-sectional views of respective processing systems 10A and 10B each configured to perform one or more of the plasma processing methods set forth herein. FIG. 1C is a close-up view of a portion of the substrate support assembly 136 shown in FIG. 1A. FIG. 2 is a simplified schematic diagram of a processing scheme that can be used with one or both of the processing systems 10A and 10B. FIGS. 3A-3B are examples of edge tuning circuits 170 that can be used with one or both of the processing systems 10A and 10B to control and adjust plasma uniformity.

In some embodiments, the processing systems 10A and 10B illustrated in FIGS. 1A and 1B are configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown in FIGS. 1A-1B, the processing systems 10A-10B are configured to form a capacitively coupled plasma (CCP), where the processing chamber 100 include an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source (e.g., RF generator 118) is electrically coupled to one of the upper or lower electrode that delivers an RF signal that is configured to ignite and maintain a plasma (e.g., the plasma 101), which is capacitively coupled to each of the upper and lower electrodes and is disposed in a processing region therebetween. Typically, the opposing one of the upper or lower electrodes is coupled to ground or to a second RF power source. In FIGS. 1A-1B, one or more components of the substrate support assembly 136, such as the support base 107, is electrically coupled to a plasma generator assembly 163, which includes the RF generator 118, and the chamber lid 123 is electrically coupled to ground.

As shown in FIGS. 1A-1B, each of the processing systems 10A and 10B includes a processing chamber 100, a substrate support assembly 136, a system controller 126, and a plasma control scheme 188. It is contemplated that in embodiments described herein that any one of or combination of the features, configurations, and/or structural components of the processing system 10A, e.g., the structural components of the substrate support assembly 136 and/or electrical components of the plasma control scheme 188, may be used in the processing system 10B, and vice versa.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. In some embodiments, the gas is fed through a showerhead (not shown). In another embodiment, the gas is feed through the sidewalls 122 (not shown). A substrate 103 is loaded into, and removed from, the processing volume 129 through an opening (not shown) in one of the one or more sidewalls 122, which is sealed with a slit valve (not shown) during plasma processing of the substrate 103.

In some embodiments, a plurality of lift pins 20 movably disposed through openings formed in the substrate support assembly 136 facilitate substrate transfer to and from a substrate supporting surface 105A. In some embodiments, the plurality of lift pins 20 are disposed above and are coupled to and/or are engageable with a lift pin hoop (not shown) disposed in the processing volume 129. The lift pin hoop may be coupled to a shaft (not shown) that sealingly extends through the chamber base 124. The shaft may be coupled to an actuator (not shown) that is used to raise and lower the lift pin hoop. When the lift pin hoop is in a raised position, it engages with the plurality of lift pins 20 to raise the upper surfaces of the lift pins above the substrate supporting surface 105A, lifting the substrate 103 therefrom and enabling access to a non-active (backside) surface the substrate 103 by a robot handler (not shown). When the lift pin hoop is in a lowered position, the plurality of lift pins 20 are flush with or recessed below the substrate supporting surface 105A, and the substrate 103 rests thereon.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10A and/or 10B.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10A and/or 10B to perform the various process tasks and various process sequences used to implement the methods described herein. In one embodiment, the program includes instructions that are used to perform one or more of the operations described below in relation to FIGS. 7 and 8A-8C.

The plasma control scheme 188 illustrated in FIGS. 1A-1B generally includes a plasma generator assembly 163, a first bias generator 196 for establishing a first PV waveform at a bias electrode 104, and a second first bias generator 197 for establishing a second PV waveform at an edge control electrode 115. In some embodiments, the plasma generator assembly 163 delivers an RF signal to the support base 107 (e.g., power electrode or cathode), which may be used to generate (maintain and/or ignite) a plasma 101 in a processing region disposed between the substrate support assembly 136 and the chamber lid 123. In some embodiments, the RF generator 118 is configured to deliver an RF signal having a frequency that is greater than 400 kHz, such as an RF frequency of about 1 MHz or more, or about 2 MHz or more, such as about 13.56 MHz or more, about 27 MHz or more, or about 40 MHz or more.

In some embodiments, the plasma control scheme 188 further includes an edge tuning circuit 170, which may be used to adjust one or more characteristics of the plasma 101 formed between the substrate support assembly 136 and the chamber lid 123. In some embodiments, the edge tuning circuit 170 may be used to adjust a density of the portion of the plasma 101 formed over a circumferential edge of a substrate 103 disposed on the substrate support assembly 136 relative to a density of the portion of the plasma 101 formed over the surface of the center of the substrate 103.

Generally, as used herein, the plasma density refers to the number of free electrons in the bulk plasma per unit volume (e.g., number of free electrons/cm$^3$), which in some embodiments may be in the range of about $10^8$ cm$^{-3}$ to about $10^{11}$ cm$^{-3}$. The edge tuning circuit 170 enables the manipulation of one or more characteristics of the RF power used to maintain the plasma 101 in the region over the edge of the substrate support assembly 136 relative to the RF power used to maintain the plasma 101 in the region over the center portion of the substrate support assembly 136. For example, the edge tuning circuit 170 may be used to adjust one or more of the voltage, current, and/or phase of the RF power at the edge of the substrate support assembly 136 relative to the RF power in the center region 103A of the substrate support assembly 136.

As discussed further below, the edge tuning circuit 170 may be electrically coupled to an edge control electrode 115 disposed in the substrate support assembly 136. In some embodiments, an RF signal used to ignite and/or maintain the plasma 101 is delivered from the plasma generator assembly 163 to the support base 107, which is capacitively coupled to the edge control electrode 115 through a layer of dielectric material disposed therebetween. The edge tuning circuit 170 may be used to adjust one or more characteristics of the RF power used to maintain the plasma in the region over the edge control electrode 115, e.g., by adjusting the voltage, current, and/or the phase of the RF power at the edge control electrode 115 relative to the RF power provided to the support base 107.

In some embodiments, the differences between the voltages, currents, and/or phases of the RF power used to ignite and/or maintain the plasma in the regions over the edge control electrode 115 and the bias electrode 104 are determined and/or monitored by measuring or determining the respective voltages, currents, and/or phases of the RF power at the edge control electrode 115 and/or the bias electrode 104. In some embodiments, one or more characteristics of the RF power at the edge control electrode 115 and/or the bias electrode 104 are measured and/or determined using the signal detection module 187 described below.

As discussed above, in some embodiments, the plasma generator assembly 163, which includes an RF generator 118 and an RF generator assembly 160, is generally configured to deliver a desired amount of a continuous wave (CW) or pulsed RF power at a desired substantially fixed sinusoidal waveform frequency to a support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105 and within the substrate support assembly 136. The RF power delivered to the support base 107 is configured to ignite and maintain a processing plasma 101 of processing gases disposed within the processing volume 129.

In some embodiments, the support base 107 is an RF electrode that is electrically coupled to the RF generator 118 via an RF matching circuit 162 and a first filter assembly 161, which are both disposed within the RF generator assembly 160. The first filter assembly 161 includes one or more electrical elements that are configured to substantially prevent a current generated by the output of a PV waveform generator 150 from flowing through an RF power delivery line 167 and damaging the RF generator 118. The first filter assembly 161 acts as a high impedance (e.g., high Z) to the PV signal generated from a PV pulse generator P1 within the PV waveform generator 150, and thus inhibits the flow of current to the RF matching circuit 162 and RF generator 118.

In some embodiments, the RF generator assembly 160 and RF generator 118 are used to ignite and maintain a processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124. However, in some embodiments, the RF generator assembly 160 is configured to deliver an RF power to the bias electrode 104 disposed in the substrate support 105 versus the support base 107.

In some embodiments, the edge tuning circuit 170 is used to control and/or adjust one or more characteristics of an RF waveform established at the edge control electrode 115 (e.g., the second RF waveform 502 illustrated in FIG. 5) relative to one or more characteristics of an RF waveform established at the bias electrode 104, (e.g., the first RF waveform 501 illustrated in FIG. 5). In some embodiments, such as shown in FIGS. 1A and 2, the edge tuning circuit 170 is electrically coupled between the edge control electrode 115 and ground. In other embodiments, such as shown in FIG. 1B and as shown in phantom in FIG. 2, the edge tuning circuit 170 may be electrically coupled between the edge control electrode 115 and the plasma generator assembly 163 and is thus electrically coupled between the edge control electrode 115 and the support base 107.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing.

In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion-resistant thermally conductive material, such as a corrosion-resistant metal, for example aluminum, an aluminum alloy, or a stainless steel and is coupled to the substrate support with an adhesive or by mechanical means.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In some embodiments, one or more characteristics of the RF power used to maintain the plasma 101 in the processing region over the bias electrode 104 are determined and/or monitored by measuring an RF waveform established at the bias electrode 104 (e.g., the first RF waveform 501 in FIG. 5). Typically, the first RF waveform 501 is established by delivering an RF signal from the plasma generator assembly 163 to the substrate support 105, which is capacitively coupled to the bias electrode 104 through a dielectric material layer 105C (FIG. 1C) disposed therebetween.

In one configuration, the bias electrode 104 is a chucking pole used to secure (i.e., chuck or electrostatically clamp) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network 116, which provides a chucking voltage thereto, such as static DC voltage between about −5000 V and about 5000 V, using an electrical conductor, such as the coaxial power delivery line 106 (e.g., a coaxial cable). As will be discussed further below, the clamping network 116 includes bias compensation circuit elements 116A, a DC power supply 155, and a bias compensation module blocking capacitor, which is also referred to herein as the blocking capacitor $C_5$. The blocking capacitor $C_5$ is disposed between the output of a pulsed voltage (PV) waveform generator 150 and the bias electrode 104.

Referring to FIGS. 1A and 1B, the substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1A, the edge control electrode 115 is positioned within a region of the substrate support 105. In some embodiments, as illustrated in FIG. 1A, the edge control electrode 115 includes a conductive mesh, foil, and/or plate that is disposed a similar distance (i.e., in the Z-direction) from the edge ring 114 as the bias electrode 104 from the substrate supporting surface 105A of the substrate support 105. In some other embodiments, such as shown in FIG. 1B, the edge control electrode 115 includes a conductive mesh, foil, and/or plate that is positioned on or within a region of a dielectric pipe 110, which surrounds at least a portion of the bias electrode 104 and/or the substrate support 105. The dielectric pipe 110 can be made of various insulators, such as aluminum oxide, aluminum nitride, or quartz. In some embodiments, the dielectric pipe 110 can include several parts made of same or different materials. Alternately, in some other embodiments (not shown), the edge control electrode 115 is positioned within or is coupled to the edge ring 114, which is disposed on and adjacent to the substrate support 105.

FIG. 1D is a close-up view of a portion of the substrate support assembly 136 shown in FIG. 1A. As shown, the edge ring 114 is positioned on the substrate support 105 and surrounds the substrate 103. The edge ring 114 may be used to protect the edge of the substrate support 105, and in some cases minimize any electrical and/or thermal discontinuities that are formed at the substrate and substrate support edge. The edge ring 114 includes one or more inner surfaces 114A that face a portion of the substrate support 105 and the peripheral (beveled) edge of the substrate 103 disposed thereon. The inner surfaces 114A of the edge ring 114 are spaced apart from the substrate support 105 and the substrate 103 disposed thereon to define one or more gaps 117A-B and may include a ledge portion 114B that is disposed below the beveled substrate edge when the substrate 103 is positioned on the substrate support 105.

In a typical etch process, the upper plasma-facing surfaces (e.g., surface 114C) of the edge ring 114 are bombarded with ions during processing resulting in ion-induced erosion of the dielectric material forming the edge ring 114. Unfortunately, because the surfaces of the edge ring 114 that define the gap regions 117A-B are less exposed to the plasma 101, they tend to accumulate processing etching byproducts which, unless removed, may cause undesired plasma arcing and/or particulate transfer between the edge ring 114 and the surface of the substrate 103. Thus, in some embodiments, the biasing and plasma control methods used to improve processing non-uniformity at the substrate edge may also be used to preferentially clean surfaces defining the edge pocket region 117.

As discussed below, the edge ring 114 may be biased using a pulsed voltage (PV) waveform, in order to control the shape of the boundary 11 of the plasma sheath as it extends over the substrate edge and the edge ring 114 to span the edge pocket region 117. The shape of the plasma sheath boundary 11 affects the energy and directionality of ions accelerated across the plasma sheath. For example, as discussed below and shown in FIGS. 8A-8C, a difference between the height of a portion of the sheath boundary 11 formed over the substrate 103 (portion 11A) and a portion of the sheath boundary formed over the edge ring 114 (portion 11C) will cause the sheath boundary to bend in a portion of the sheath boundary that spans the edge pocket region 117 (bend portion 11B). Changes in sheath thickness and bending of the sheath boundary, respectively, affect the ion energy and ion directionality of ions that impinge the surfaces of the substrate 103 and edge ring 114 disposed there below. Thus, control over the plasma sheath boundary 11 across the edge pocket region 117 allows for adjustments in ion energy and ion directionality at surfaces of the substrate edge region 103A, which may be used to improve substrate processing uniformity. The improved control over the plasma sheath boundary 11 may also be used to perform the in-situ plasma cleaning methods described herein so as to target surfaces 114A-B of the edge ring 114 to clean undesired processing byproducts therefrom.

The edge control electrode 115 is generally positioned so that when used with the edge tuning circuit 170 and/or biased using the pulsed biasing scheme 140 (FIGS. 1A-1B), due to its position relative to the substrate 103, it can affect or alter a portion of the generated plasma 101 that is over or outside of the circumferential edge of the substrate 103. In some embodiments, the bias generators 196, 197 may be used to control the shape of the sheath boundary 11 over the plasma-facing surfaces of the substrate support assembly 136. For example, due to repeated ion bombardment, the edge ring 114 will typically experience plasma-based erosion that reduces the edge ring thickness over its useful lifetime. If the thickness of the plasma sheath formed over the edge ring 114 were to remain the same, the thinning of the edge ring 114 would eventually result in a bending of the plasma sheath boundary, causing non-uniform processing results at the substrate edge. Thus, in some embodiments, one or more characteristics of a pulsed voltage (PV) waveform established at the bias electrode 104 and/or edge control electrode 115 may be adjusted to compensate for changes in the height of the edge ring 114 over the edge ring's useful lifetime in order to maintain a substantially uniform sheath boundary 11 over the edge of the substrate 103.

In some embodiments, the edge tuning circuit 170, electrically coupled to the edge control electrode 115, may be used to manipulate one or more characteristics of the RF power used to ignite and/or maintain the plasma in the processing region 129A over the edge control electrode 115. For example, in some embodiments, the edge tuning circuit 170 may be used to adjust and/or manipulate one or more of the voltage, current, and/or phase of the RF power used to ignite and/or maintain the plasma 101 in the processing region disposed between the edge control electrode 115 and the chamber lid 123.

In some embodiments, one or more characteristics of the RF power used to maintain the plasma 101 in the processing region over the edge control electrode 115 are determined and/or monitored by measuring one or more differences between the second RF waveform 502 and the first RF waveform 501 respectively established at the edge control electrode 115 and the bias electrode 104. In some embodiments, the differences in the one or more characteristics of the second RF waveform 502 and the first RF waveform 501 may be manipulated by use of the edge tuning circuit 170 to adjust the plasma density in the region over the circumferential edge of the substrate 103 and/or spanning the edge pocket region 117.

In some embodiments, the differences in the characteristics of the second RF waveform 502 and the first RF waveform 501 can be used to preferentially form a plasma between the edge ring 114 and the edge of the substrate 103, effectively concentrating the plasma in the edge pocket region 117 to remove undesired processing byproducts from surfaces therein. Thus, the edge tuning circuit 170 may be beneficially used to control the generation of activated species in the bulk plasma, which enables fine control over the ion and/or radical flux at the edge of the substrate 103 (edge region 103B) relative to the center region 103A of the substrate 103, and/or the concentration of plasma in the edge pocket region 117.

The edge control electrode 115 can be biased by the use of a PV waveform generator 150 that is different from the PV waveform generator 150 that is used to bias the bias electrode 104. In some embodiments, the edge control electrode 115 can be biased by use of a PV waveform generator 150 that is also used to bias the bias electrode 104 by splitting part of the power to the edge control electrode 115. In one configuration, a first PV waveform generator 150 of the first bias generator 196 is configured to bias the bias electrode 104, and a second PV waveform generator 150 of a bias generator 197 is configured to bias the edge control electrode 115.

In some embodiments, one or more characteristics of the generated RF power are measured and/or determined using a signal detection module 187 that is communicatively coupled to the system controller 126. The signal detection module 187 is generally configured to receive electrical signals from electrical signal traces (not shown) that are electrically coupled to various components within the processing systems 10A and 10B, e.g., at nodes N. The signal detection module 187 may include a plurality of input channels 172 each configured to receive an electrical signal from a corresponding electrical signal trace and a data acquisition module 169. The received electrical signals can include, without limitation, one or more characteristics of the RF signal delivered to the support base 107, the RF waveforms established at one or both of the bias electrode 104 and the edge control electrode 115, the pulsed voltage (PV) waveforms established at one or both of the bias electrode 104 and the edge control electrode 115, and the chucking voltages delivered to one or both of the bias electrode 104 and the edge control electrode 115.

In some embodiments, the data acquisition module 169 is configured to generate a control signal that is used to automatically control one or more characteristics of the RF signal, RF waveforms, PV waveforms, and/or chucking voltages during substrate processing. In some embodiments, desired changes in one or more characteristics are communicated to the signal detection module 187 by the system controller 126, and the data acquisition module 169 may be used to implement the desired change.

Referring to FIGS. 1A and 1B, the second bias generator 197 includes a clamping network 116 so that a bias applied to the edge control electrode 115 can be similarly configured to the bias applied to the bias electrode 104 by the clamping network 116 coupled within the first bias generator 196.

In some embodiments, the processing chamber 100 further includes the dielectric pipe 110, or collar, that at least partially circumscribes portions of the substrate support assembly 136 as a dielectric barrier between RF hot substrate support assembly 136 and a grounded liner 108, and also to prevent the substrate support 105 and/or the support base 107 from contact with corrosive processing gases or plasma, cleaning gases or plasma, or byproducts thereof. Typically, the dielectric pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Substrate Support Assembly Configurations

Figure 3D:
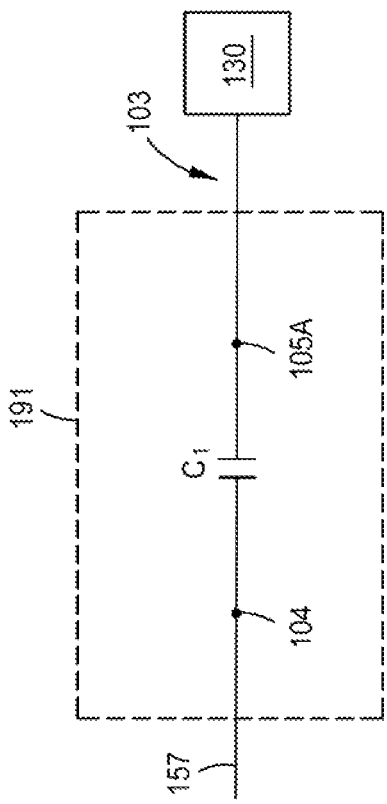
FIGS. 3D and 3E are functionally equivalent circuit diagrams of different electrostatic chuck (ESC) types that may be used with one or both of the processing systems illustrated in FIGS. 1A-1B.
Figure 3E:
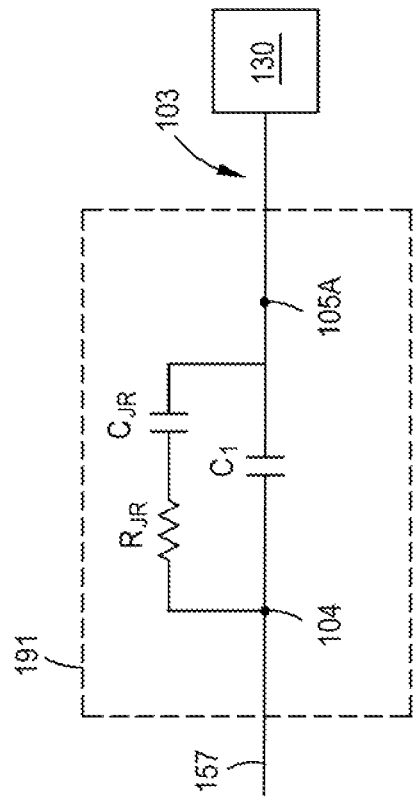

FIG. 1C is a close-up view of a portion of the substrate support assembly 136 shown in FIG. 1A and includes a simplified electrical schematic representation of the electrical characteristics of the various structural elements within one or more embodiments of the substrate support assembly 136. The simplified electrical schematic representation illustrated in FIG. 1C is equally applicable to the corresponding structural elements of the substrate support assembly 136 depicted in FIG. 1B. Here, the substrate support assembly 136 is configured as an electrostatic chuck (ESC) and may be either one of a Coulombic type ESC or a Johnsen-Rahbek type ESC. A simplified equivalent circuit model 191 for a Coulombic ESC and a Johnsen-Rahbek ESC are illustrated in FIGS. 3D and 3E, respectively, and discussed below. Generally, in either ESC configuration of substrate support assembly 136, the substrate 103 is secured to the substrate support 105 by providing a potential between the substrate 103 and a bias electrode 104, which results in an electrostatic attraction force therebetween. In one embodiment, the bias electrode 104 is also used to facilitate the pulsed voltage (PV) waveform biasing schemes described herein.

The substrate support 105 provides a substrate supporting surface 105A that is formed of a dielectric material and includes the bias electrode 104 embedded in the dielectric material. The bias electrode 104 is spaced apart from a substrate support surface 105A, and thus the substrate 103, by the first dielectric material layer 105B, and from the support base 107, by a second dielectric material layer 105C.

In some embodiments, the ESC configuration may be used to secure the substrate 103 to the substrate support 105 in a relatively low-pressure (e.g., ultra-high vacuum) processing environment. In some embodiments, it may be desirable to heat and/or cool the substrate 103 during processing to maintain the substrate at a desired processing temperature. In those embodiments, the substrate support assembly 136 may be configured to maintain the substrate 103 at the desired temperature by heating or cooling the substrate support 105, and thus the substrate 103 disposed thereon. Often, in those embodiments, the substrate supporting surface 105A is patterned to have raised portions (e.g., mesas) that contact the substrate 103 and recessed portions that define a backside volume 105D with the substrate 103. During substrate processing, a gas source 173 fluidly coupled to the substrate support assembly 136 may be used to deliver an inert gas, such as helium, to the backside volume 105D, to improve heat transfer between the substrate supporting surface 105A and the substrate 103 disposed thereon. In some embodiments, the gas source 173 is used to deliver the inert gas to a region disposed between the edge ring 114 and a surface of the substrate support assembly 136 disposed there below.

The bias electrode 104 is electrically coupled to a DC power supply 155 (described above in FIGS. 1A-1B), which is configured to provide a potential between the substrate 103 and the bias electrode 104 and thus generate an electrostatic attraction (chucking force) therebetween. The substrate support assembly 136 may be configured as either one of a Coulombic ESC or Johnsen-Rahbek ESC, where the Johnsen-Rahbek type ESC may provide higher chucking forces and use a lower chucking voltage when compared to the Coulombic type ESC. In the Coulombic ESC, the dielectric material selected for the first dielectric material layer 105B will typically have a higher electrical resistance than a dielectric material selected for a Johnsen-Rahbek ESC resulting in the differences in the simplified functionally equivalent circuit models 191 illustrated in FIGS. 3D and 3E respectively.

In the simplest case, e.g., the circuit model 191 for the Coulombic ESC shown in FIG. 3D, the first dielectric layer 105B is formed of a dielectric material assumed to function as an insulator, e.g., having an infinite resistance $R_{JR}$, and the functionally equivalent circuit model 191 thus includes a direct capacitance $C_1$ between the bias electrode 104 and the substrate 103 through the first dielectric layer 105B. In some embodiments of the Coulombic ESC, the dielectric material and thickness $T_{DL1}$ of the first dielectric material layer 105B are be selected so that the capacitance $C_1$ is between about 5 nF and about 100 nF, such as between about 7 and about 20 nF. For example, the dielectric material layer 105B may be formed of a ceramic material (e.g., aluminum oxide ($Al_2O_3$), etc.) and have a thickness $T_{DL1}$ between about 0.1 mm and about 1 mm, such as between about 0.1 mm and about 0.5 mm, for example, about 0.3 mm.

In the more complex case, such as illustrated in the circuit model 191 of the Johnsen-Rahbek ESC shown in FIG. 3E, the circuit model 191 includes a capacitance $C_1$ that is coupled in parallel with a dielectric material resistance $R_{JR}$ and gap capacitance $C_{JR}$. Typically, in a Johnsen-Rahbek ESC the dielectric material layer 105B is considered "leaky," in that it is not a perfect insulator and has some conductivity, since, for example, the dielectric material may be a doped aluminum nitride (AlN) having a permittivity (ε) of about 9. As with the circuit model 191 for the Coulombic ESC shown in FIG. 3D, there is a direct capacitance $C_1$ between the bias electrode 104 and the substrate 103 through the dielectric material layer 105B and the backside volume 105D filled with helium. The volume resistivity of the dielectric layer within a Johnsen-Rahbek ESC is less than about $10^{12}$ ohms-cm (Ω-cm), or less than about $10^{10}$ Ω-cm, or even in a range between $10^8$ Ω-cm and $10^{12}$ Ω-cm, and thus the dielectric material layer 105B can have a dielectric material resistance $R_{JR}$ in a range between $10^6$-$10^{11}$ Ωs. In the model 191 of FIG. 3E, a gap capacitance $C_{JR}$ is used to account for the gas-containing backside volume 105D between the substrate 103 and substrate supporting surface 105A. It is expected that the gap capacitance $C_{JR}$ has a capacitance a bit larger than the capacitance $C_1$.

Referring back to FIG. 1C, the electrical schematic representation of the circuit formed within the substrate support assembly 136 includes a support base dielectric layer capacitance $C_2$, which represents the capacitance of the second dielectric material layer 105C. In some embodiments, the thickness of the portion of the second dielectric material layer 105C is greater than the thickness of the first dielectric material layer 105B. In some embodiments, the dielectric materials used to form the dielectric layers on either side of the biasing electrode are the same material and form the structural body of the substrate support 105. In one example, the thickness of the second dielectric material layer 105C (e.g., $Al_2O_3$ or AlN), as measured in a direction extending between the support base 107 and the bias electrode 104, is greater than 1 mm, such as having a thickness between about 1.5 mm and about 100 mm. The support base dielectric layer capacitance $C_2$ will typically have a capacitance between about 0.5 and about 10 nanofarads (nF).

The electrical schematic representation of the circuit formed within the substrate support assembly 136, as shown in FIG. 1C, also includes a support base resistance $R_P$, an insulator plate capacitance $C_3$, and ground plate resistance $R_G$ that is coupled to ground on one end. Since the support base 107 and ground plate 112 are typically formed from a metal material, the support base resistance $R_P$ and ground plate resistance $R_G$ are quite low, such as less than a few milliohms. The insulator plate capacitance $C_3$ represents the capacitance of the dielectric layer positioned between the bottom surface of the support base 107 and the top surface of the ground plate 112. In one example, the insulator plate capacitance $C_3$ has a capacitance between about 0.1 and about 1 nF.

Biasing and Edge Control Schemes

FIG. 2 is a simplified schematic diagram of a biasing and edge control scheme that can be used with one or both of the processing systems 10A-10B illustrated in FIGS. 1A and 1B. As shown in FIG. 2, the RF generator 118 and PV waveform generators 150 are configured to deliver an RF waveform and pulsed-voltage waveforms, respectively, to one or more electrodes disposed within the processing volume 129 of the processing chamber 100. In one embodiment, the RF generator 118 and PV waveform generators 150 are configured to simultaneously deliver an RF waveform and pulsed-voltage waveform(s) to one or more electrodes disposed within the substrate support assembly 136.

As discussed above, the edge tuning circuit 170 is generally configured to control the uniformity of a plasma formed between the chamber lid 123 and the substrate support assembly 136, e.g., by controlling the plasma density (i.e., the free electron density in the bulk plasma) over the circumferential edge of the substrate 103. In some embodiments, as shown in FIG. 1A and FIG. 2, the edge tuning circuit 170 is electrically coupled between the edge control electrode 115 (edge biasing electrode) and ground. In other embodiments, as shown in FIGS. 1B and in phantom in FIG. 2, the edge tuning circuit 170 is electrically coupled between the edge control electrode 115 and the plasma generator assembly 163, e.g., between the edge control electrode 115 and the RF generator 118.

In some embodiment, the edge tuning circuit 170 is configured as a resonant circuit that includes an inductor and a capacitor (e.g., an LC circuit) that may be used to adjust the voltage, current, and/or phase of the RF power used to maintain the plasma in the region over the edge control electrode. Example electrical circuits 170a, 170b, 170c, which may be used as the edge tuning circuit 170 in any one of the embodiments described herein, are illustrated in FIGS. 3A-3C. As shown, the edge tuning circuits 170a, 170b are each electrically coupled between the power delivery line 158 and ground (i.e., between the edge control electrode 115 and ground). However, it is contemplated that each of the example edge tuning circuits 170a, 170b may also be electrically coupled between the power delivery line 158 and the plasma generator assembly 163 (i.e., between the edge control electrode 115 and the RF generator 118), as shown in FIG. 1B. In some other embodiments, the edge tuning circuits 170 may be electrically coupled to the power delivery line 158, the plasma generator assembly 163, and ground at the same time, such as shown for the example edge tuning circuit 170c in FIG. 3C.

In one embodiment, shown in FIG. 3A, the edge tuning circuit 170a includes an inductor $L_2$ and a variable capacitor $C_7$ arranged in parallel (i.e., a parallel LC resonant circuit). In another embodiment, shown in FIG. 3B, the edge tuning circuit 170b includes the inductor $L_2$ and the variable capacitor $C_7$ arranged in series (i.e., a serial LC resonant circuit). In another embodiment, shown in FIG. 3C, the edge tuning circuit 170c includes an inductor $L_2$ and the variable capacitor $C_8$ arranged in series (i.e., a serial LC resonant circuit) between the edge control electrode 115 and the plasma generator assembly 163 (i.e., between the edge control electrode 115 and the RF generator 118) and a second variable capacitor $C_7$ that is coupled to a node that is disposed between the inductor $L_2$ and the variable capacitor $C_8$ within the power delivery line 158 and ground.

In some embodiments, one or both of the variable capacitors $C_7$, $C_8$ are adjustable from at least about 50 pF to at least about 200 pF, such as from at least about 20 pF to about at least 250 pF.

The type of LC resonant circuit, e.g., parallel, serial, or other structures, selected for the edge tuning circuit 170 may depend on the mechanical dimensions of the substrate support assembly 136, and the resulting electrical couplings between the conductive parts or electrodes, such as the edge ring, 114, the edge control electrode 115, the support base 107, the bias electrode 104, the substrate 103, and the ground plate 112.

In some embodiments, the type of LC resonant circuit can be selected based on the desired ability to control the plasma density distribution that can be achieved by adjusting one or more parameters of the LC resonant circuit so that one or more characteristics of the second RF waveform 502 (FIGS. 5A-5B) established at the edge control electrode 115, relative to the one or more characteristics of the first RF waveform 501 established at the bias electrode 104, can be adjusted. Simulated results of different control characteristics that can be achieved for exemplary edge tuning circuits 170 are described below in FIGS. 6A-6D.

Referring back to FIG. 2, in one non-limiting example, the RF generator 118 and a PV waveform generator 150 are configured to deliver an RF waveform and pulsed-voltage waveform to the support base 107 and bias electrode 104, respectively, which are both disposed in the substrate support assembly 136. In another example, the RF generator 118, a first PV waveform generator 150 and a second PV waveform generator 150 are configured to deliver an RF waveform, a first pulsed-voltage waveform and a second pulsed-voltage waveform to the support base 107, the bias electrode 104, and the edge control electrode 115, respectively, which are all disposed in the substrate support assembly 136.

As illustrated in FIG. 2, the RF generator 118 is configured to provide a sinusoidal RF waveform (RF signal) to one or more electrodes disposed in the chamber body 113 by delivering the RF signal, which includes the sinusoidal RF waveforms, here the RF waveforms 501, 502 (FIGS. 5A-5B), through the RF (plasma) generator assembly 160, which includes the RF matching circuit 162 and the first filter assembly 161. Additionally, each of the PV waveform generators 150 are configured to provide a PV waveform, which typically includes a series of voltage pulses (e.g., nanosecond voltage pulses), to the one or more electrodes disposed in the chamber body 113 by establishing a PV waveform at the bias electrode 104 through the second filter assembly 151. The components within the clamping network 116 can be optionally positioned between each PV waveform generator 150 and the second filter assembly 151.

During processing, a PV waveform is provided to the bias electrode 104 by the PV waveform generator 150 of the first bias generator 196 and a PV waveform is provided to the edge control electrode 115 by the PV waveform generator 150 of the second bias generator 197. The PV waveforms provided to the load (e.g., the complex load 130 shown in FIGS. D-3E) disposed within the processing chamber 100. The PV waveform generators 150 are coupled to the bias electrode 104 and the edge control electrode 115 through the respective power delivery lines 157 and 158. The overall control of the delivery of the PV waveform from each of the PV waveform generators 150 is controlled by use of signals provided from the system controller 126.

In one embodiment, the PV waveform generators 150 are configured to output a periodic voltage function at time intervals of a predetermined length, for example, by use of a signal from a transistor-transistor logic (TTL) source (not shown). The periodic voltage function generated by the transistor-transistor logic (TTL) source can be two-states DC pulses between a predetermined negative or positive voltage and zero. In one embodiment, a PV waveform generator 150 is configured to maintain a predetermined, substantially constant negative voltage across its output (i.e., to ground) during regularly recurring time intervals of a predetermined length, by repeatedly closing and opening one or more switches at a predetermined rate. In one example, during a first phase of a pulse interval a first switch is used to connect a high voltage supply to the bias electrode 104, and during a second phase of the pulse interval a second switch is used to connect the bias electrode 104 to ground. In another embodiment, the PV waveform generator 150 is configured to maintain a predetermined, substantially constant positive voltage across its output (i.e., to ground) during regularly recurring time intervals of a predetermined length, by repeatedly closing and opening its internal switch (not shown) at a predetermined rate.

In one configuration, during a first phase of a pulse interval a first switch is used to connect the bias electrode 104 to ground, and during a second phase of the pulse interval a second switch is used to connect a high voltage supply to the bias electrode 104. In an alternate configuration, during a first phase of a pulse interval a first switch is positioned in an open state, such that the bias electrode 104 is disconnected from the high voltage supply and the bias electrode 104 is coupled to ground through an impedance network (e.g., inductor and resistor connected in series). Then, during a second phase of the pulse interval, the first switch is positioned in a closed state to connect the high voltage supply to the bias electrode 104, while the bias electrode 104 remains coupled to ground through the impedance network.

The PV waveform generators 150 may include a PV generator and one or more electrical components, such as but not limited to high repetition rate switches (not shown), capacitors (not shown), inductors (not shown), fly back diodes (not shown), power transistors (not shown) and/or resistors (not shown), which are configured to provide a PV waveform to an output. An actual PV waveform generator 150, which can be configured as a nanosecond pulse generator, may include any number of internal components.

A power delivery line 157 electrically connects the output of the PV waveform generator 150 of the first bias generator 196 to an optional filter assembly 151 and the bias electrode 104. While the discussion below primarily discusses the power delivery line 157 of the first bias generator 196, which is used to couple a PV waveform generator 150 to the bias electrode 104, the power delivery line 158 of the second bias generator 197, which couples a PV waveform generator 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by the output of the RF generator 118 from flowing through the power delivery line 157 and damaging the PV waveform generator 150. The optional filter assembly 151 acts as a high impedance (e.g., high Z) to RF signal generated by the RF generator 118, and thus inhibits the flow of current to the PV waveform generator 150.

In some embodiments, as shown in FIGS. 1A-1B, the PV waveform generator 150 of the first bias generator 196 is configured to provide a pulsed voltage (PV) waveform signal to the bias electrode 104, and eventually the complex load 130 (FIGS. 3D-3E), by delivering the generated pulsed voltage (PV) waveforms through the blocking capacitor $C_5$, the filter assembly 151, the power delivery line 157, and capacitance $C_1$ (FIG. 1C). In some embodiments, the plasma control scheme 188 may further include a blocking resistor (not shown) positioned within the components connecting the clamping network 116 to a point within the power delivery line 157. The main function of the blocking capacitor $C_5$ is to protect the PV waveform generator 150 from the DC voltage produced by the DC power supply 155, which thus drops across blocking capacitor $C_5$ and does not perturb the output of the PV waveform generator 150. The purpose of the blocking resistor in the clamping network 116 is to block the pulsed voltage generated by the PV waveform generator 150 enough to minimize the current it induces in the DC power supply 155.

Waveform Examples

Figure 4:
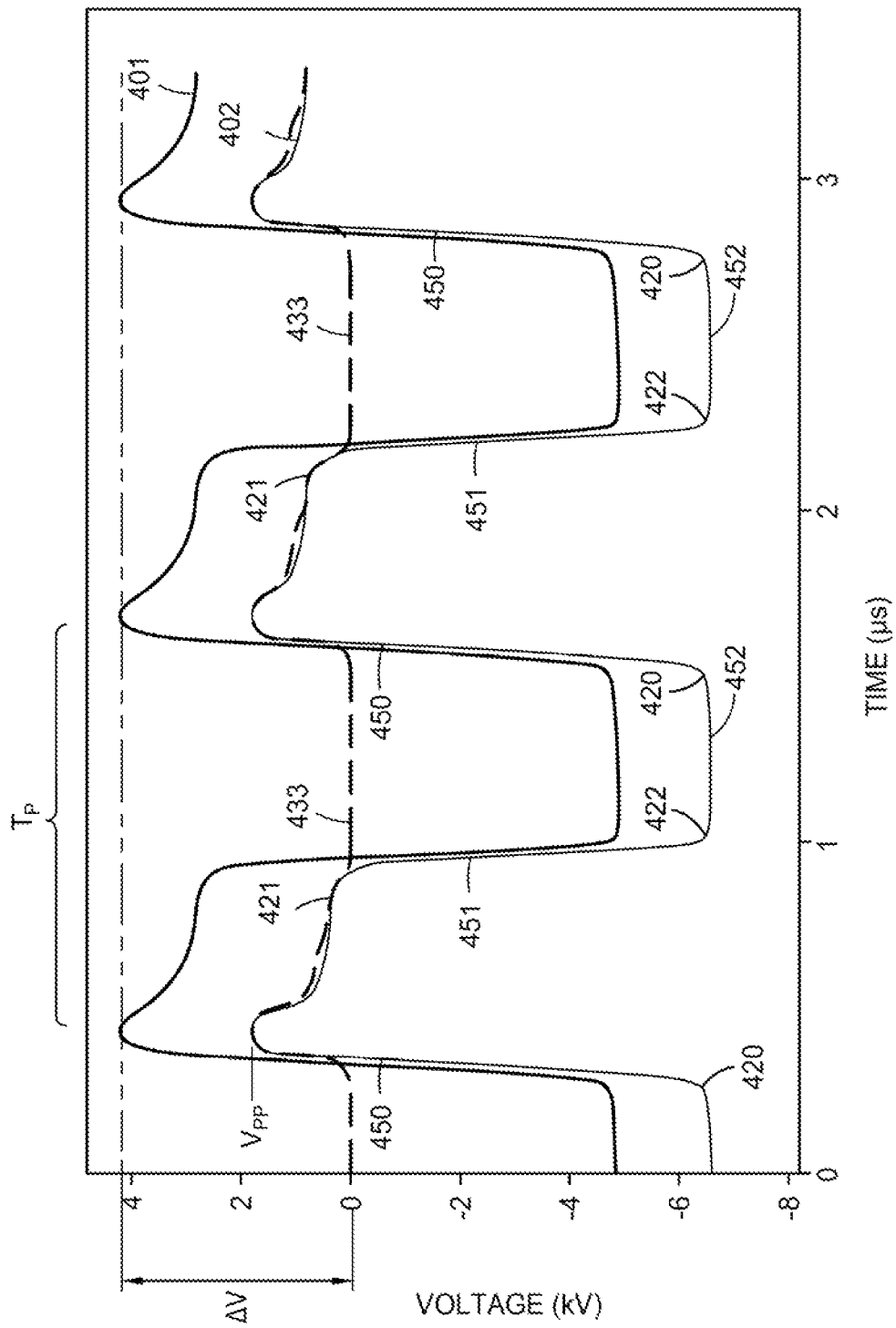
FIG. 4 illustrates examples of pulsed voltage (PV) waveforms that can be established using embodiments described herein.

FIG. 4 illustrates an example of a PV waveform 402 established at a substrate 103 due to a PV waveform 401 established at the bias electrode 104. Here, the PV waveform 401 is established at the bias electrode 104 and/or edge control electrode 115 by use of the PV waveform generator 150 within the respective bias generators 196, 197 and a DC voltage source 155 of the corresponding clamping network 116.

Generally, the output of the PV waveform generator 150, which can be controlled by a setting in a plasma processing recipe stored in the memory of the controller 126, forms the PV waveform 401, which includes a peak-to-peak voltage $V_{PP}$ also referred to as the pulse voltage level $V_{pp}$.

The PV waveform 402, which has a waveform period $T_P$, is the waveform seen by the substrate 103 due to the delivery of the PV waveform 401 to the bias electrode 104, is characterized as including a sheath collapse and recharging phase 450 (or for simplicity of discussion, the sheath collapse phase 450) that extends between point 420 and point 421, a sheath formation phase 451 that extends between point 421 and point 422, and an ion current phase 452 that extends between point 422 and back to the start at point 420 of the next sequentially established pulse voltage waveform. The sheath collapse phase 450 generally includes a time period where the capacitance of the sheath is discharged and the substrate potential is brought to the level of the local plasma potential 433.

Depending on the desired plasma processing conditions, it may be desirable to control and set at least the PV waveform characteristics, such as PV waveform frequency ($1/T_P$), pulse voltage level $V_{pp}$, pulse voltage on-time, and/or other parameters of the PV waveform 401 to achieve desirable plasma processing results on a substrate. In one example, pulse voltage (PV) on-time, which is defined as the ratio of the ion current time period (e.g., time between point 422 and the subsequent point 420 in FIG. 4) and the waveform period $T_p$, is greater than 50%, or greater than 70%, such as between 80% and 95%. In some embodiments, the PV waveform generator 150 is configured to provide a constant voltage during the ion current phase 452, as shown in FIG. 4. In some embodiments, the PV waveform generator 150 is configured to provide a shaped pulse voltage waveform (not shown) having a nonzero slope in the ion current phase 452, by use of one or more internal switches and DC power supplies. In some embodiments, the PV waveform generator 150 is configured to provide a constant positive voltage during one of the phases of a voltage pulse, such as during the sheath collapse phase 450 only (not shown). Generally, a DC offset ΔV found in each PV waveform at the bias electrode is dependent on the bias applied by the DC power supply 155 in the clamping network 116 and various properties of the PV waveform generator 150 configuration used to establish the PV waveform 401.

In some embodiments, due to the ion current ($I_i$) depositing positive charge on the substrate surface during the ion current phase 452, the voltage at the substrate surface will increase over time, as seen by the positive slope of the line between points 422 and 420. The voltage increase over time at the substrate surface will reduce the sheath voltage and result in a spread of the ion energy distribution. Therefore, it is desirable to control and set at least the PV waveform frequency ($1/T_{PD}$), where $T_{PD}$ is PV waveform period to minimize the effects of the reduction in the sheath voltage and spread of the ion energy distribution.

Figure 5A:
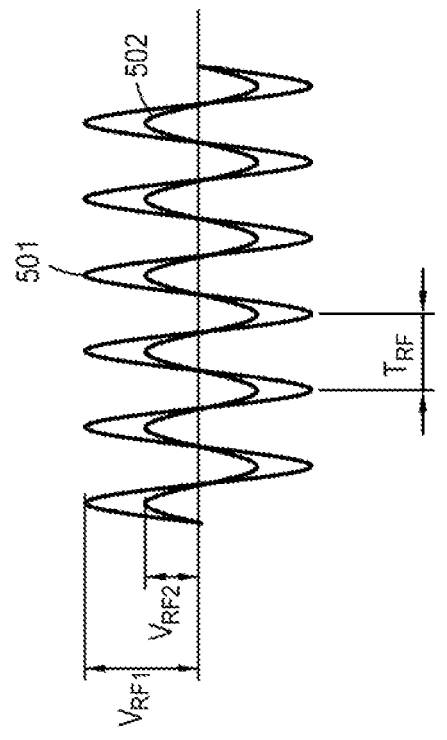
FIGS. 5A-5B illustrate example radio frequency (RF) waveforms that can be established using embodiments described herein.
Figure 5B:
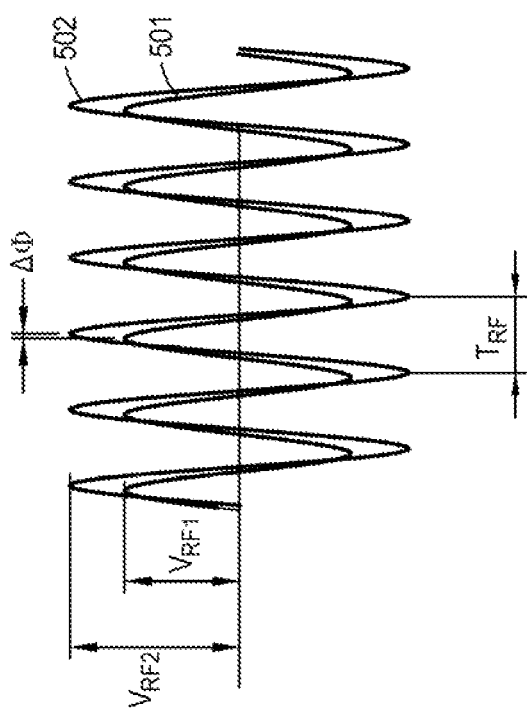

FIGS. 5A-5B illustrate a first RF waveform 501 established at the bias electrode 104 and a second RF waveform 502 established at the edge control electrode 115, due to the capacitive coupling of the RF signal provided to the support base 107 by the RF generator 118 within the plasma generator assembly 163. The waveform characteristics of the first RF waveform 501 and the second RF waveform 502 are controlled by use of the edge tuning circuit 170 configuration, such as one of the configurations illustrated in FIG. 3A (parallel LC resonant circuit), FIG. 3B (serial resonant circuit) and FIG. 3C (more complex resonant circuit). The example waveforms illustrated in FIGS. 5A-5B and the simulated results shown below in FIGS. 6A-6D are not intended to be limiting as to the scope of the disclosure provided herein but are provided to simplify the discussion.

Generally, the RF signal provided to the support base 107 has a relatively high frequency, so that the first RF waveform 501 and the second RF waveform 502 have a correspondingly high frequency ($1/T_{RF}$) of about 1 MHz or greater, for example, between about 30 MHz and about 60 MHz. The edge tuning circuit 170 as described in the various embodiments disclosed herein may be used to adjust one or more characteristics of the second RF waveform 502 established at the edge control electrode 115 relative to one or more characteristics of the first RF waveform 501 established at the bias electrode 104. In some embodiments, the one or more relative characteristics include a ratio of RF waveform amplitude between the second RF waveform 502 and the first RF waveform 501 (e.g., voltage amplitude ratio $V_{RF2}/V_{RF1}$), a ratio of RF current amplitude between the second RF waveform 502 and the first RF waveform 501 (e.g., current amplitude ratio not shown), a phase difference (Δϕ) between the second RF waveform 502 and the first RF waveform 501, and/or a ratio of RF delivered power between the second RF waveform 502 and the first RF waveform 501 (e.g., delivered power ratio not shown).

The one or more characteristics of the second RF waveform 502 relative to the first RF waveform 501 can be determined and/or monitored by measuring the respective voltages, currents, phase, and/or power of the RF waveforms established at the edge control electrode 115 and the bias electrode 104. The measured characteristics of the second RF waveform 502 and the first RF waveform 501 correspond to properties of the bulk plasma in the portions formed above the edge control electrode 115 and the bias electrode 104, respectively, such as the plasma density. The determined differences between the second RF waveform 502 and the first RF waveform 501 can be used to monitor and control the differences in electron density in the portion of the bulk plasma formed over the edge ring 114 and the electron density of the portion of the bulk plasma formed over the center portion of the substrate 103. The uniformity and/or distribution of plasma density may be controlled and/or adjusted to achieve desired processing results by use of the edge tuning circuit 170, such as by using the system controller 126 to adjust the variable capacitor $C_7$.

Figure 6A:
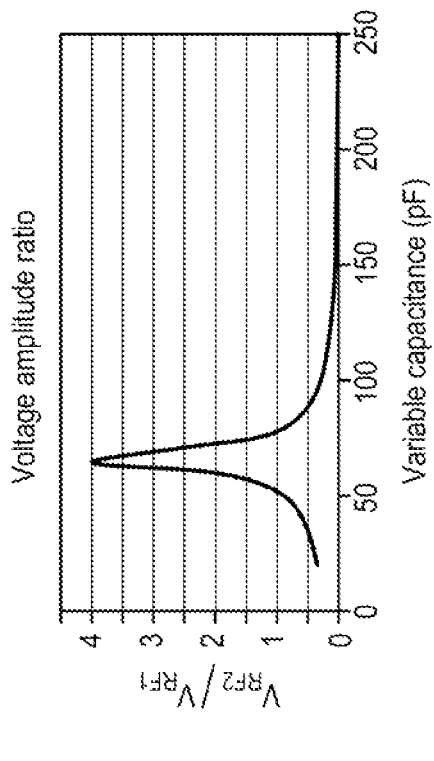
FIGS. 6A-6D are graphs of simulated results using example edge tuning circuit configurations according to embodiments herein.
Figure 6C:
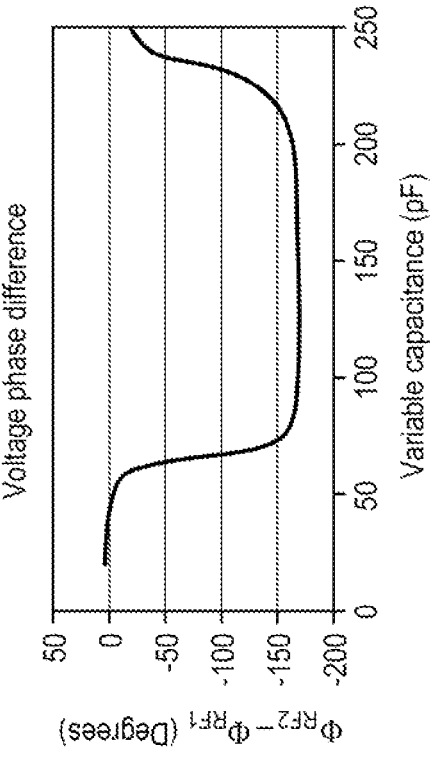
Figure 6B:
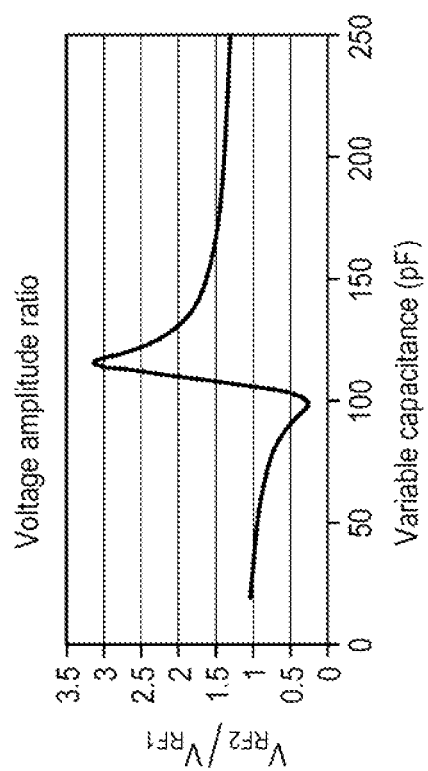
Figure 6D:
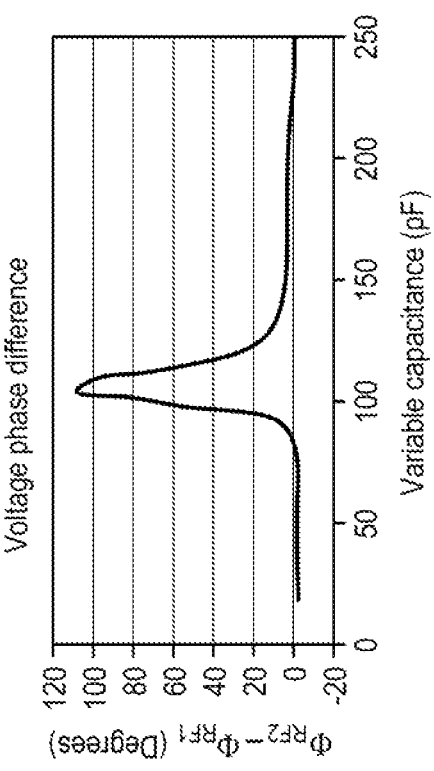

Non-limiting simulated results for the edge tuning circuit 170 illustrated in FIGS. 3A and 3B are shown in FIGS. 6A-6B, and simulated results for the edge tuning circuit 170 with combined series and parallel configuration illustrated in FIG. 3C are shown in FIGS. 6C-6D. In FIGS. 6A and 6C, the simulated results provide an example of LC circuit tuning curves that illustrate the effect of varying the capacitance (e.g., by adjusting variable capacitor $C_7$ of the respective edge tuning circuit 170 configurations) across the range of about 20 pF to about 250 pF on the ratio of voltage amplitude between second RF waveform 502 and first RF waveform 501 (e.g., $V_{RF2}/V_{RF1}$). In FIGS. 6B and 6D, the simulated results provide an example of LC circuit tuning curves that illustrate the effect that varying the capacitance of $C_7$ has on the phase difference between the second RF waveform 502 and the first RF waveform 501 (e.g., $\phi_{RF2}-\phi_{RF1}$).

As shown in FIG. 6A, a variable capacitance $C_7$ of the edge tuning circuit 170 (configuration in FIG. 3A) having a value of about 170 pF has a corresponding voltage amplitude ratio ($V_{RF2}/V_{RF1}$) of about 1.5. As shown in FIG. 6B, the phase difference corresponding to the 170 pF capacitance for an edge tuning circuit 170 having the same configuration as in FIG. 6A is relatively small, e.g., less than 5 degrees, thus resulting in amplification of the second RF waveform 502 relative to the first RF waveform 501 and a small phase difference (Δϕ) therebetween, as shown in FIG. 6A.

In FIGS. 6C-6D the variable capacitance $C_7$ of the edge tuning circuit 170 (configuration in FIG. 3C) may be set to a value of about 25 pF and the resulting voltage amplitude ratio ($V_{RF2}/V_{RF1}$) is equal to about 0.5 (FIG. 6C), and the phase difference (Δϕ) is about null, as shown in FIG. 6D.

As shown in FIG. 6A, the simulated results based on the edge tuning circuit 170 configuration of FIG. 3A (e.g., parallel LC resonant circuit) show resonance peaks at about 100 pF and about 120 pF. In FIG. 6D, the simulated results for the edge tuning circuit 170 (configuration of FIG. 3C) show a resonance phase transitions at 60 pF and 250 pF. In some embodiments, it may be desirable to operate the respective edge tuning circuit 170 at either side of the resonance during the period an RF plasma is maintained. In some embodiments, the edge tuning circuit 170 may be configured, e.g., by use of variable capacitors in combination of parallel and series LC circuits, to allow switching operation of the edge tuning circuit 170 between either side of a resonance peak without crossing through the resonant region. As noted above, the simulated results shown in FIGS. 6A-6D are not intended to be limiting as other edge tuning circuit 170 configurations may be used to provide other desired operating ranges for amplifying, reducing, and/or equalizing the voltage amplitude ratio ($V_{RF2}/V_{RF1}$)

and/or a current amplitude ratio and/or phase difference between the second RF waveform 502 and the first RF waveform 501.

In some embodiments, it may be desirable to select a tuning circuit configuration and/or variable capacitance $C_7$ that causes a phase difference between the respective RF waveforms, which amplifies the electric field between the edge control electrode 115 and the bias electrode 104. The amplified electric field results in corresponding increase in plasma density in the portion of the plasma 101 formed over the substrate support assembly 136 at some distance between the two electrodes. In some embodiments, it may be desirable to select a tuning circuit configuration and/or variable capacitance $C_7$ that does not cause a phase difference between the RF waveforms established at the respective electrodes so that the plasma density remains substantially uniform across the region spanning the edge of the substrate 103.

Beneficially, the edge tuning circuit 170 may be configured to provide a broad range of desired plasma processing conditions to control and/or adjust the plasma density distribution at different points between the center and edge of the substrate 103. The characteristics of the edge tuning circuit 170, and thus position of the system on the tuning curves (FIGS. 6A-6D) may be controlled using the system controller 126, by adjusting one or more variable capacitors $C_7$. The controlled adjustment of the characteristics of edge tuning circuit by the system controller 126 will allow for relatively easy changes in plasma processing conditions, within a single substrate plasma process, between consecutive substrate plasma processes, and/or for different types of substrates, without the need for manually changing hardware related configurations. In some embodiments, one or both of the bias generators 196, 197, the edge tuning circuit 170, or combinations thereof may be used to preferentially clean surfaces of the substrate support assembly 136 in the edge pocket region 117 during in-situ plasma cleaning methods, such as described below in relation to FIGS. 7A-7C and 8A-8C.

In some embodiments, the edge tuning circuit 170 is automatically adjusted to maintain desired processing conditions, such as to account for plasma uniformity drift due to changes in the geometries and/or materials of the various components of the processing chamber 100 over time. For example, the methods may be used to automatically adjust the tuning circuit, such as by changing the capacitance $C_7$, to account for changes in the thickness of the edge ring 114 that may be caused by erosion of the dielectric material from the edge ring 114 due to ion bombardment. For example, in some embodiments, the system controller 126, by use of the signal detection module 187, may be configured to detect signals of one or more electrical parameters at corresponding nodes N of the processing system 10A, 10B; determine whether the processing system 10A, 10B is operating within desired processing conditions by comparing the characteristics of the detected signals with one or more control limits; and, when the electrical signal characteristics are outside of the control limits, adjust one or more components of the edge tuning circuit 170. Some embodiments include automatically adjusting the edge tuning circuit, such as adjusting the capacitance $C_7$ to maintain a desired RF voltage amplitude ratio, RF current amplitude ratio, and/or RF phase difference between the different RF waveforms at the edge control electrode 115 and the bias electrode 104.

In some embodiments, the system controller 126 is configured to automatically adjust the edge tuning circuit 170 based on desired processing conditions and/or desired characteristics between the RF waveform at the edge control electrode 115 and the bias electrode 104 by comparing the processing condition(s) and/or RF waveforms to predetermined limits, e.g., control limits, and changing one or more set points, such as capacitance $C_7$, of the edge tuning circuit 170 based on an algorithm or lookup table stored in memory 134 of the system controller 126.

In some embodiments, the edge tuning circuit 170 may be manually adjusted and/or controlled by adjusting one or more components of the edge tuning circuit 170 to a desired set point, and/or within desired control limits, where the desired set point and/or control lists are selected by a user and stored in the instructions used to control the processing system 10A, 10B. For example, a capacitance $C_7$ of the edge tuning circuit 170 may be controlled to a desired capacitance determined by a user and stored in memory of the system controller 126.

In general, the pulsed voltage (PV) waveforms established the electrodes 104 and 115, such as either the negative pulse waveforms 401, shaped pulse waveforms 441 or positive pulse waveforms 431, include a periodic series of pulse voltage (PV) waveforms repeating with a period $T_{PD}$, on top of a voltage offset ($\Delta V$). In one example, the period $T_{PD}$ of the PV waveforms can be between about 1 μs and about 5 μs, such as about 2.5 μs, e.g., between about 200 kHz and about 1 MHz, or about 400 kHz, such as about 1 MHz or less, or about 500 kHz or less.

As discussed above, in some embodiments, the processing chamber 100 will at least include one or more RF generators 118, and their associated first filter assembly 161, and one or more PV generators 314, and their associated second filter assembly 151, that are together configured to deliver desired waveforms to one or more electrodes disposed within the substrate support assembly 136. The software instruction stored in memory of the system controller 126 are configured to cause the generation of an RF waveform that is configured to establish, maintain and control one or more aspects of a plasma formed within the processing chamber. The one or more aspects of the plasma that are controlled can include but are not limited to, plasma density, plasma chemistry, and ion energy in the plasma formed in the processing volume 129.

Processing Method Examples

Figure 7A:
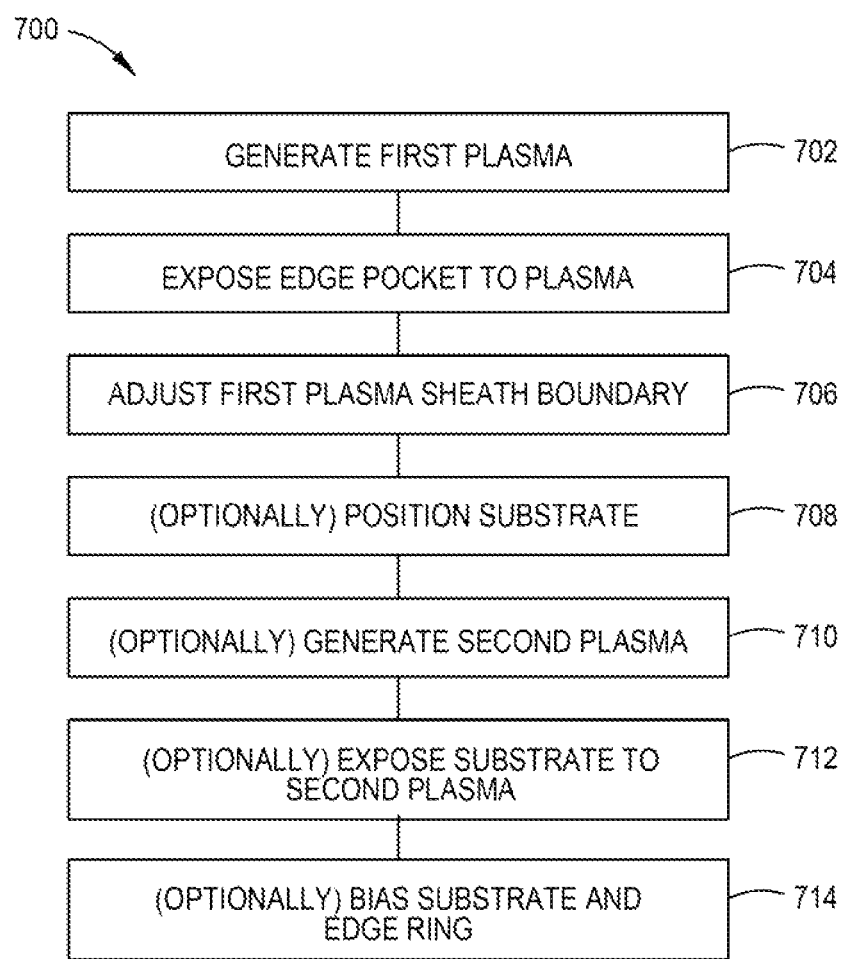
FIGS. 7A-7C are diagrams illustrating methods that can be performed using embodiments described herein.
Figure 7B:
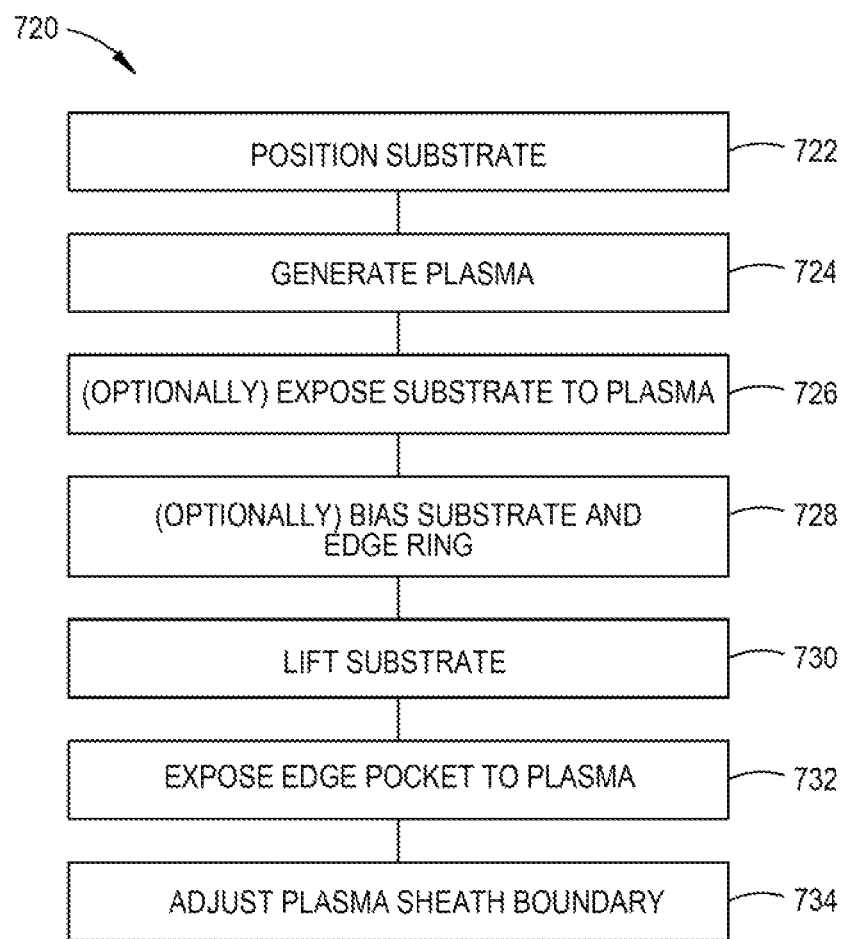
Figure 7C:
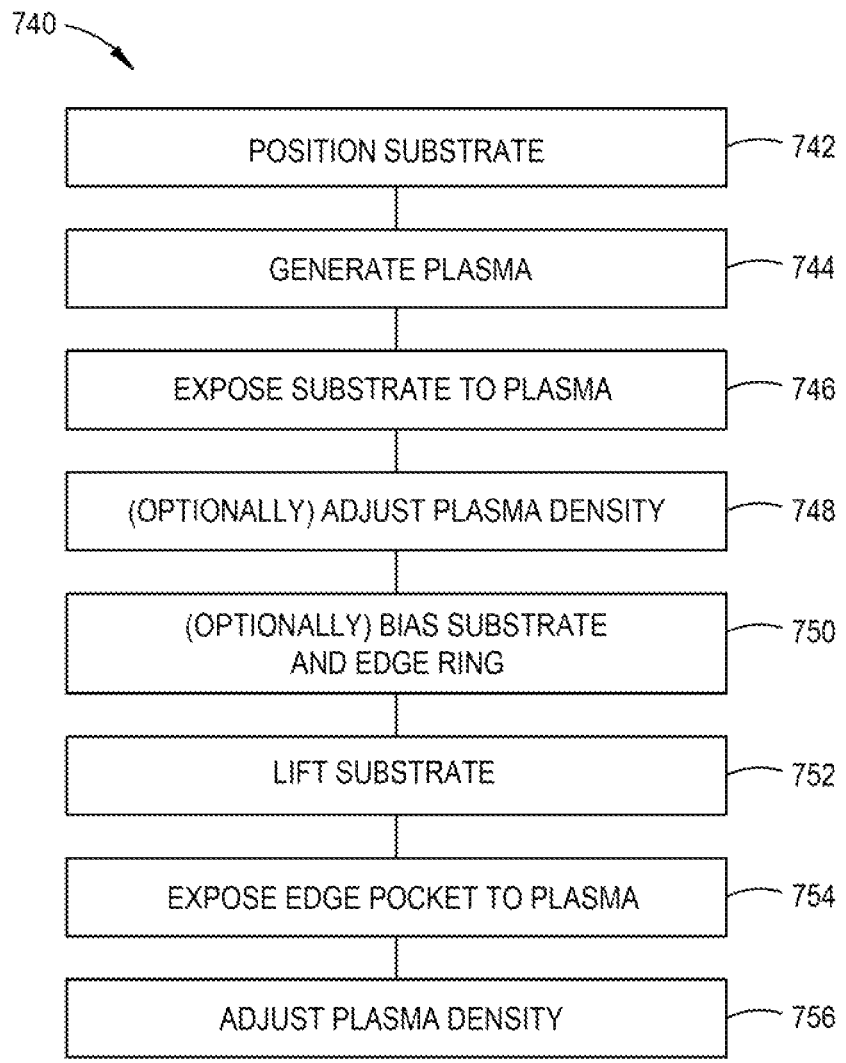
Figure 8C:
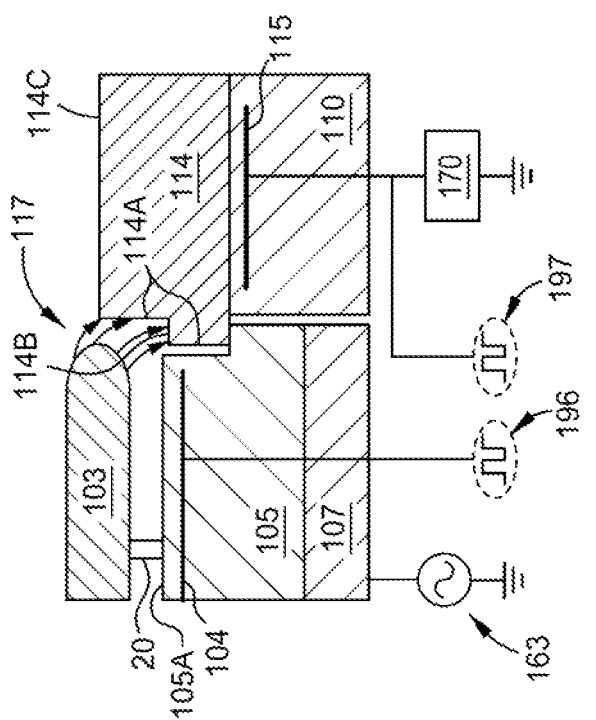

FIGS. 7A-7C are process flow diagrams illustrating respective methods that can be used to clean processing byproducts from surfaces of a substrate support assembly. FIGS. 8A-8C are close-up views of a substrate support assembly 136 used to illustrate aspects of the methods set forth in FIGS. 7A-7C. In FIGS. 8A-8C, portions of the substrate support assembly 136 are configured as shown in FIG. 1B where the edge control electrode 115 is disposed in or on the material of a dielectric pipe 110 that surrounds the substrate support 105. However, it is contemplated that the methods described below may be used with any one or combination of the substrate support assembly configurations described herein, such as where the edge control electrode 115 is disposed within the dielectric material of the substrate support 105 (FIGS. 1A, 1D), or is disposed in and/or is coupled to the edge ring 114.

FIG. 7A is a process flow diagram illustrating a method 700 of preferentially cleaning surfaces defining the edge pocket region 117 of a substrate support assembly 136, according to one embodiment. FIGS. 1A-1D and FIG. 8A are referred to in the description below to illustrate aspects of the method 700 but are not intended to be limiting as it is contemplated that the method 700 may be performed on other processing systems that are configured to separately bias a substrate and an edge ring. Generally, the method 700 uses an in-situ plasma (plasma formed in the processing chamber 100) to remove accumulated processing byproducts from the edge ring 114, and/or the portions of the substrate supporting surface 105A adjacent thereto. The method 700 is used to manipulate the shape of a plasma sheath boundary 11 (FIG. 8A) formed over the substrate support assembly 136 by increasing or decreasing the voltage between the edge ring 114 and the plasma relative to the voltage between the substrate supporting surface 105A and the plasma 101. The difference in voltage results in a corresponding difference in ion energy at the surfaces 114A-C and 105A, and in some embodiments, causes a bend in the plasma sheath boundary that may be advantageously used to preferentially direct the plasma generated ions towards desired portions of the substrate support assembly 136. For example, as shown in FIG. 8A, a difference between the height of a portion 11A of the sheath boundary 11 formed over the substrates supporting surface 105A and the portion 11C of the sheath boundary 11 formed over the edge ring 114 causes the sheath boundary to bend in the portion spanning the edge pocket region 117 (bend portion 11B).

At activity 702, the method 700 includes generating a first plasma in a processing region of a processing chamber, where the processing chamber 100 may include any one or combination of the features illustrated in FIGS. 1A-1D. Here, the processing region 129A is defined by a chamber lid 123 and the substrate support assembly 136. Referring now to FIG. 8A, the substrate support assembly 136 generally includes a first portion of dielectric material 105B that forms a substrate supporting surface 105A and an edge ring 114 that surrounds a substrate 103 (shown in phantom) when the substrate 103 is disposed on the substrate supporting surface 105A. One or more edge pocket surfaces 114A,B of the edge ring 114 and a peripheral edge of the first portion of dielectric material 105B define an edge pocket region 117 where the edge pockets surfaces 114A, B are disposed inwardly of a chamber lid facing surface 114C.

In some embodiments, the substrate support assembly 136 further includes a bias electrode 104 that is spaced apart from the substrate supporting surface 105A by the first portion of dielectric material 105B and an edge control electrode 115 that is disposed a distance from the center of the bias electrode 104. Generally, the edge control electrode 115 is spaced apart from the bias electrode 104 by dielectric material of the substrate support assembly 136 that may include dielectric material of the substrate support 105, dielectric material used to form the dielectric pipe 110, dielectric material of the edge ring 114 when the edge control electrode 115 is embedded therein, or combinations thereof. Here, the bias electrode 104 is electrically coupled to a first bias generator 196 that is configured to establish a first pulsed voltage (PV) waveform at the bias electrode 104. The edge control electrode 115 is electrically coupled to a second bias generator 197 that is configured to establish a second pulsed voltage (PV) waveform at the edge control electrode 115.

In some embodiments, the first plasma generated at activity 702 is a capacitively coupled plasma (CCP) generated using a radio frequency (RF) signal from an RF waveform generator 163 electrically coupled to the substrate support assembly 136, such as electrically coupled to the support base 107, where the chamber lid 123 is electrically coupled to ground (as shown) or a second RF generator. In other embodiments (not shown), the first plasma may be a CCP formed using an RF generator electrically coupled to the chamber lid 123 where the substrate support assembly 136 is electrically coupled to ground. In other embodiments, the first plasma may be an inductively coupled plasma (ICP) formed using an RF generator electrically coupled to one or more ICP coils (not shown) disposed over the chamber lid 123.

In some embodiments, the RF signal used to generate the first plasma has a frequency that is greater than 400 kHz, such as a frequency of about 1 MHz or more, or about 2 MHz or more, such as about 13.56 MHz or more, about 27 MHz or more, about 40 MHz or more, or, for example, between about 30 MHz and about 200 MHz, such as between about 30 MHz and about 160 MHz, between about 30 MHz and about 120 MHz, or between about 30 MHz and about 60 MHz.

At activity 704, the method includes exposing the edge ring 114 and substrate supporting surface 105A to the first plasma. In some embodiments, the first plasma is formed of an oxygen-containing gas, a hydrogen-containing gas, a halogen-containing gas, such as a fluorine and/or chlorine based gas, or a combination thereof. In some embodiments, radical species generated in the plasma react with processing byproducts that have accumulated on surfaces within the processing volume 129, such as the surfaces 114A-C of the edge ring 114. The reaction forms a volatile species, which is evacuated from the processing volume 129 through the vacuum outlet 120. In some embodiments, the first time period with RF plasma may be about 1 second or more, such as about 5 seconds or more, or about 10 seconds or more.

At activity 706 of the method 700, the plasma sheath boundary of the first plasma over the edge pocket area is adjusted by tuning the variable capacitors $C_7$ and/or $C_8$ in the edge tuning circuit 170, and/or by establishing pulsed voltage (PV) waveforms at the edge control electrode 115 to provide a greater voltage between the bulk plasma and the edge ring 114 than between the bulk plasma and the substrate supporting surface 105A.

In some embodiments, the second pulsed voltage (PV) waveform established at the edge control electrode during activity 706 comprises a series of repeating cycles where a voltage waveform within each cycle has a first portion that occurs during a first time interval (e.g., the sheath collapse phase 452) and a second portion that occurs during a second time interval (e.g., the sheath formation phase 451 and the ion current phase 452). Generally, the voltage during the first interval is different from the voltage during the second interval, and their voltage difference determines the energy of the ions accelerated across the sheath and to the edge ring 114.

In some embodiments, a voltage established at the bias electrode by the first pulsed voltage (PV) waveform generator 150, herein the bias voltage, is maintained at effectively zero volts $V_{PP}$ (e.g., about 0 volts+/−1 volts (null volts)) during at least a plurality of the repeating cycles of the second PV waveform established at the edge control electrode 115 at activity 704. For example, in some embodiments, the second PV waveform may be established at the edge control electrode 115 at nonzero $V_{PP}$ and a pulse voltage $V_{PP}$ established at the bias electrode using the first PV waveform generator may be maintained at effectively zero volts (e.g., about 0 volts+/−1 volts (null volts)) for about 1 second or more, such as about 5 seconds or more, or about 10 seconds or more. In some embodiments, the bias electrode 104 is coupled to ground during the first time period by use of a switch that is coupled between the power delivery line 157 and ground. In another embodiment, the PV waveform generator 150 or another driver (not shown) may be used to drive the bias voltage to null volts.

In some embodiments, such as shown in FIG. 8A, activities 702, 704, and 706 are performed without a substrate 103 (shown in phantom) so that the substrate supporting surface 105A is exposed to the first plasma. Beneficially, the difference in potential between the portion of the plasma formed over the substrate supporting surface 105A and the portion of the plasma formed over the edge ring 114 causes the plasma sheath boundary 11 to bend at portion 11B. The shape of the plasma sheath boundary shown in FIG. 8A is configured to preferentially direct the plasma generated ions based on the bend portion 11B formed towards the edge pocket surfaces 114A-B. By directing the plasma generated ions towards the edge pocket surfaces 114A-B and simultaneously reducing the voltage between the plasma and the substrate supporting surface 105A, the method 700 may be used to preferentially clean surfaces of the edge ring 114 while substantially reducing undesired plasma-based erosion of the substrate support 105.

In some embodiments, the method 700 optionally includes processing a substrate 103 using a second plasma formed before or after the preferential cleaning process described in activities 702-706. For example, the method 700 may optionally include positioning a substrate 103 on the substrate supporting surface 105A at activity 708, generating a second plasma in the processing region 129A at activity 710, exposing the substrate 103 to the second plasma for a second time period at activity 712, and establishing the first pulsed voltage (PV) waveform at the bias electrode 104 at activity 714. In some embodiments, the substrate 103 used to perform optional activities 708-714 of the method 700 is a non-production substrate, i.e., the substrate is of a type used to perform cleaning, testing, and/or maintenance operations commonly referred to as a "blanket" or "dummy" wafer.

In some embodiments, activity 708 of the method 700 further includes electrostatically clamping the substrate 103 to the substrate support 105 by delivering a chucking voltage to the bias electrode 104 from a DC power supply 155 that is electrically coupled to the bias electrode 104 using a power delivery line 157. The chucking voltage is used to create a voltage potential difference between the substrate 103 and the bias electrode 104, and thus an electrostatic attraction (chucking force) through the capacitance $C_1$ (FIG. 1C) of the first portion of dielectric material disposed therebetween. In some embodiments, the method 700 further includes electrostatically clamping an edge ring 114 to the substrate support assembly 136 by delivering a chucking voltage to the edge control electrode 115 from a DC power supply 155 that is electrically coupled to the edge control electrode 115 using a power delivery line 158. In some embodiments, the method 700 includes flowing an inert gas, e.g., helium, into a backside volume 105D (FIG. 1D) disposed between the substrate 103 and the substrate supporting surface 105A and/or between the edge ring 114 and a surface of the substrate support assembly 136 to facilitate heat transfer therebetween.

In some embodiments, activity 714 of the method 700 further includes adjusting one or more characteristics of the second pulsed voltage (PV) waveform relative to one or more characteristics of the first pulsed voltage (PV) waveform to control the shape of a plasma sheath boundary 11 formed over the substrate 103 and the edge ring 114 during the second time period. Thus, in some embodiments, activity 714 includes adjusting one or more characteristics of the first PV waveform established at the bias electrode 104 relative to one or more characteristics of the second PV waveform established at the edge control electrode 115. In some embodiments, adjusting one or more characteristics includes adjusting one or a combination of the PV waveform frequency ($1/T_P$), pulse voltage level $V_{pp}$, pulse voltage on-time, of the first and/or second PV waveforms established at the bias electrode 104 and the edge control electrode 115 respectively. In some embodiments, the one or more characteristics may be controlled to bend the plasma sheath at the substrate edge or edge of the substrate support 105, to increase or decrease the height of the sheath over the edge control electrode 115 relative to the height of the sheath over the bias electrode 104 to allow for fine tuning of the ion trajectories and ion energies at the edge region of the substrate 103 or substrate support 105.

FIG. 7B is a process flow diagram illustrating a method 720 of preferentially cleaning surfaces defining the edge pocket region 117 of a substrate support assembly 136, according to one embodiment. Aspects of the method 720 are schematically illustrated in FIG. 8B. However, it is contemplated that the method 720 may be performed using any of the processing system configurations described in FIGS. 1A-1D. In some embodiments, the substrate 103 is a non-production substrate, i.e., the substrate is of a type used to perform cleaning, testing, and/or maintenance operations commonly referred to as a "blanket" or "dummy" wafer. In other embodiments, the method 720 may be implemented during the plasma processing of a production substrate having at least partially formed semiconductor devices thereon, e.g., to remove processing byproduct residues from a bevel edge or backside edge of the production substrate.

Here, the method 720 generally includes preferentially cleaning surfaces that define the edge pocket region 117 by adjusting characteristics of the respective pulsed voltage (PV) waveforms established at the bias electrode 104 and the edge control electrode 115. During the cleaning process, a substrate 103 remains over the substrate supporting surface 105A so the substrate 103 is disposed between the substrate supporting surface 105A and the plasma. The substrate 103 provides a cover to prevent ion bombardment and erosion of the substrate supporting surface 105A. In some embodiments, the substrate 103 is at least partially lifted from the substrate supporting surface 105A to allow plasma and/or radical species formed in the plasma to more easily diffuse into the edge pocket region 117 and react with processing byproducts, e.g., carbon containing polymers, formed on surfaces therein. It is contemplated that at least some of the activities of the method 720 may be the same or substantially similar to corresponding activities of the method 700 described above.

The method 720 generally includes positioning the substrate 103 on a substrate support assembly 136 at activity 722, generating a plasma at activity 724, so that the substrate 103 and edge ring 114 are (optionally) exposed to the plasma for a first period of time at activity 726, and optionally adjusting a plasma sheath boundary at activity 728 by biasing one or both of the substrate 103 and the edge ring 114.

Positioning the substrate 103 at activity 722 generally includes transferring the substrate 103 to the substrate supporting surface 105A. In some embodiments, the substrate is electrically clamped to the substrate support assembly, such as described in activity 708 of the method 700. The plasma may be generated at activity 724 using an RF signal, such as described above at activity 702 and/or activity 710 of the method 700.

In some embodiments, the substrate 103 is optionally exposed to the plasma for a first time period at activity 728 and the substrate 103 and the edge ring 114 are optionally biased, e.g., by using the first and second pulsed voltage waveform generators to establish PV waveforms at the bias and edge control electrodes, such as described in activities 712 and 714 of the method 700.

At activity 730, the method 720 includes at least partially lifting the substrate 103 from the substrate supporting surface 105A, such as shown in FIG. 8B. Typically, the substrate 103 is at least partially lifted from the substrate supporting surface 105A using the plurality of lift pins 20 that extend through the substrate support assembly 136. When the substrate is electrostatically clamped to the substrate support 105, such as described in activity 708, at least partially lifting the substrate 103 may include stopping or adjusting the delivery of the chucking voltage to the bias electrode 104 and/or discharging the electrostatic charge between the substrate 103 and the bias electrode 104, e.g., by setting the DC voltage potential of the bias electrode 104 to be similar as the DC voltage potential of the substrate 103.

At activities 732 and 734, the method 720 respectively includes exposing the edge pocket surfaces 114A-B to the plasma and concurrently adjusting the plasma sheath boundary 11. Activities 732 and 734 may be performed using a substantially similar processes as used to perform activities 704 and 706 of the method 700 with the addition of the partially lifted substrate 103 disposed over the substrate-supporting surface 105A. It is contemplated that any one or more of the activities of the method 720 may be used in combination with the method 740 or vice versa to increase in-situ plasma cleaning efficiency in the edge pocket region 117 while simultaneously protecting the substrate supporting surface 105A from undesirable plasma-based erosion.

FIG. 7C is a process flow diagram illustrating a method 740, according to another embodiment, of preferentially cleaning edge pockets surfaces 114A-B of the substrate support assembly 136. It is contemplated that the method 740 may be performed using any of the processing systems described herein, such as any one of the substrate support assemblies 136 in FIGS. 1A-1D and 8A-8C. As illustrated in FIG. 8C, the method 740 generally includes using the tuning circuit 170 to concentrate a plasma between the peripheral edge of a substrate 103 that is at least partially lifted from the substrate supporting surface 105A and the edge pocket surface 114A-B, e.g., the edge pocket region 117. The concentrated plasma increases radical and ion concentration in the edge pocket region 117, which may be used to preferentially clean the surfaces 114A-B therein. Typically, the substrate 103 is only partially lifted to a distance small enough to prevent plasma from forming between the substrate 103 and the substrate supporting surface 105A, thus preventing plasma-based erosion thereof. In some embodiments, the substrate 103 is a non-production substrate commonly referred to as a "blanket" or "dummy" wafer. In other embodiments, the method 740 may be implemented during the plasma processing of a production substrate having at least partially formed semiconductor devices thereon, e.g., to remove processing byproduct residues from a bevel edge or backside edge of the production substrate.

Activity 742 of the method 740 includes positioning a substrate 103 on a substrate supporting surface 105A of a substrate support assembly 136, such as shown in FIG. 8C. Activity 742 may be the same or substantially similar as activity 722 of the method 720.

Activity 744 of the method 740 includes igniting and maintaining a plasma by use of a radio frequency (RF) signal. In some embodiments, the RF signal is delivered to a support base 107 of a substrate support assembly 136 using a plasma generator assembly 163 that is electrically coupled thereto. Here, the RF signal is configured to ignite and/or maintain a processing plasma 101 in a processing region 129A of the processing chamber 100, where the processing region 129A is disposed between the substrate support assembly 136 and the chamber lid 123. In some embodiments, the RF signal has a frequency of about 1 MHz or greater, such as about 20 MHz or greater, for example between about 30 MHz and about 60 MHz, or about 40 MHz.

Typically, the RF signal delivered to the support base 107 establishes a first RF waveform 501 (FIGS. 6A-6B) at the bias electrode 104, which is capacitively coupled to the support base 107 through a third portion of dielectric material (e.g., dielectric material layer 105C) disposed therebetween. The bias electrode 104 is spaced apart from the processing plasma by the first portion of dielectric material (e.g., the dielectric material layer 105B), and the substrate 103 disposed on a substrate support surface 105A. In some embodiments, the method 740 further includes electrostatically clamping the substrate 103 to the substrate support 105, such as described in activity 708 of the method 700.

At activity 746, the method 740 includes exposing a surface of the substrate 103 to the plasma for a first time period. Activity 748 of the method 740 optionally includes adjusting one or both of the plasma density and/or the shape of the plasma sheath boundary 11. In some embodiments, adjusting the plasma density includes adjusting one or more characteristics of the second RF waveform 502 established at the edge control electrode 115 relative to one or more characteristics of the first RF waveform 501 established at the bias electrode 104. In some embodiments, adjusting the one or more characteristics of the second RF waveform 502 relative to the one or more characteristics of the first RF waveform 501 includes changing a voltage amplitude ratio (e.g., $V_{RF2}/V_{RF1}$) between the second RF waveform 502 and the first RF waveform 501, as shown in FIG. 5A or 5B, adjusting a current amplitude ratio between the second RF waveform 502 and the first RF waveform, adjusting a phase difference, e.g., delta $\phi$, between the second RF waveform 502 and the first RF waveform 501, or a combination thereof. In some embodiments, adjusting the one or more characteristics of the second RF waveform 502 relative to the first RF waveform 501 is performed by adjusting the electrical characteristics of one or more of the elements within the edge tuning circuit 170.

In some embodiments, adjusting the second RF waveform 502 relative to the first RF waveform 501 changes the plasma uniformity across at least a portion of the processing region 129A (FIGS. 1A-1B). For example, in one embodiment, the processing region 129A is defined by the chamber lid 123 and substrate support assembly 136, and the plasma 101 is a bulk plasma that is formed therebetween. In some embodiments, a first portion of the plasma 101 is formed in a region disposed between the chamber lid 123 and the bias electrode 104, and a second portion of the plasma 101 is formed in a region disposed between the chamber lid 123 and the edge control electrode 115. In those embodiments, adjusting the second RF waveform 502 relative to the first RF waveform 501 changes a plasma density in the second portion of the plasma 101 relative to a plasma density in the first portion of the plasma 101.

In some embodiments, adjusting the one or more characteristics of the second RF waveform 502 established at the edge control electrode 115 relative to the one or more characteristics of first RF waveform 501 established at the bias electrode 104 includes using the edge tuning circuit 170. In some embodiments, the edge tuning circuit 170 includes one or more variable capacitors $C_7$, $C_8$ and adjusting the one or more characteristics of the second RF waveform 502 relative to the one or more characteristics of first RF waveform 501 includes changing one or more capacitance $C_7$, $C_8$. Adjusting the edge tuning circuit 170 may be done automatically so that the system controller 126 adjusts the electrical characteristics of one or more components of the edge tuning circuit 170, such as the capacitance $C_7$, $C_8$ based on the desired characteristics of the RF waveforms 501, 502 and/or the desired differences therebetween.

For example, in some embodiments, the system controller 126, by use of the signal detection module 187, may be configured to: determine characteristics of the respective waveforms by measuring one or more characteristics of electrical signals taken at one or more nodes N; compare the determined characteristics to desired characteristics, and, based on the comparison, change an output of a component of the edge tuning circuit 170. In some embodiments, the edge tuning circuit 170 may be adjusted manually where a user changes a set point for a component of the edge tuning circuit 170, such as the capacitance of a variable capacitor $C_7$, $C_8$ or an inductance L of the circuit. The user may change the set point using the system controller 126 and/or the signal detection module 187, e.g., by changing a recipe parameter corresponding to the component or another setting in the instructions used by the system controller 126 to operate the processing system 10A, 10B.

Generally, assuming a relatively constant RF power is provided to the support base 107 from the plasma generator assembly 163, an increase in the $V_{RF2}/V_{RF1}$ ratio, by use of the edge tuning circuit 170, will result in an increase in the ratio of plasma density near the edge of the substrate relative to a plasma density near the center of the substrate. The comparative increase in plasma density provides a corresponding increase in plasma generated species in the bulk plasma and thus a relative increase in ion flux and reactive neutral molecule concentration at the edge of the substrate surface there below. Similarly, a drop in the $V_{RF2}/V_{RF1}$ ratio will result in a drop the ratio of plasma density near the edge of the substrate to the plasma density near the center of the substrate to cause a corresponding drop in ion flux and reactive neutral molecule concentration at the edge of the substrate.

By controlling the relative plasma densities between the first and second portions of the plasma, a corresponding distribution of activated species within the processing region 129A may also be controlled and used to improve global processing non-uniformity, such as within-wafer processing non-uniformity. Advantageously, activity 748 may be implemented as a processing parameter adjustment, such as by controlling the edge tuning circuit 170 using the system controller 126 to adjust the capacitance $C_7$ and/or $C_8$. Thus, the method 740 may be implemented without resorting to mechanical adjustments or changes in hardware configurations that are typically needed to adjust bulk plasma distribution in a capacitively coupled plasma (CCP) system and thus prevent the fine control thereof.

Activity 750 of the method 700 optionally includes biasing the substrate 103 and/or the edge ring 114 by establishing pulsed voltage (PV) waveforms at one or both of the bias electrode 104 and edge control electrode 115. The process used to bias the substrate 103 and/or the edge ring 114 during the first time period may be the same or substantially similar to the process described in activity 714 of the method 700.

Activity 752 of the method 740 includes at least partially lifting the substrate from the substrate supporting surface 105A, which may be performed using the same or a substantially similar process and described in activity 830 of the method 720. At activity 754, the method 740 includes exposing the edge pocket surfaces 114A-B to the plasma for a time period.

Before or during activities 752 and 754, activity 756 of the method 740 includes adjusting one or more characteristics of the radio frequency (RF) waveforms respectively established at the bias electrode 104 and the edge control electrode 115 to form a plasma in the edge pocket region 117 for at least a portion of the time period. In some embodiments, adjusting one or more characteristics of the RF waveforms includes adjusting a phase difference, e.g., delta $\phi$, between the second RF waveform 502 and the first RF waveform 501 to cause the plasma to form between the peripheral edge of the substrate 103 and the edge pocket surfaces 114A-B. Here, the substrate is at least partially lifted to provide enough of a gap or space between the substrate and the edge pocket surfaces 114A-B to allow the plasma to form therebetween while maintaining a small enough gap between the substrate and the substrate supporting surface 105A to prevent plasma from forming therein. In some embodiments, bias voltages respectively established at the bias electrode 104 and edge control electrode 115 using the waveform generators 150 electrically coupled thereto are maintained at a constant or null value during at least a portion of the time period. For example, in some embodiments bias voltages established at one or both of the bias electrode 104 and edge control electrode 115 are maintained at effectively zero volts $V_{PP}$ (e.g., about 0 volts+/−1 volts (null volts)) for at least a portion of the time period, such as about 1 second or more, about 5 seconds or more, or about 10 seconds or more. Maintaining the bias voltages at effectively zero volts $V_{PP}$ may include coupling the respective electrodes to ground or using the PV waveform generator 150 or another driver (not shown) to drive the bias voltage to null volts, such as described in relation to FIG. 7A for the method 700.

In some embodiments, the method 740 further includes preferentially adjusting the plasma density towards the portion of the plasma 101 formed over the edge control electrode 115 relative to the plasma density of the portion of the plasma formed over the bias electrode 104. Here, preferentially adjusting the plasma density includes changing a voltage amplitude ratio (e.g., $V_{RF2}/V_{RF1}$) between the second RF waveform 502 and the first RF waveform 501, as shown in FIG. 6A or 6B, adjusting a current amplitude ratio between the second RF waveform 502 and the first RF waveform, adjusting a phase difference, e.g., delta $\phi$, between the second RF waveform 502 and the first RF waveform 501, or a combination thereof.

The above-described embodiments may be used alone or in combination to provide fine control over the generation and distribution of activated species within a processing region of an inductively coupled plasma (ICP) chamber or a capacitively coupled plasma (CCP) chamber. Beneficially, the embodiments may be performed by use of a system controller without adjusting or modifying individual chamber components, thus providing a processing recipe parameter that can easily be adjusted during the processing of a single substrate and/or between sequentially processed substrates. The RF plasma density control methods may be implemented independently and/or in combination with the pulsed voltage (PV) waveform biasing methods to provide independent and fine control over ion energy, IEDF, ion directionality, ion flux and reactive neutral molecule concentration at the substrate surface when compared to a conventional RF biased CCP system.

While the foregoing is directed to embodiments of the present disclosure, other and further embodiments of the disclosure may be devised without departing from the basic scope thereof, and the scope thereof is determined by the claims that follow.

What is claimed is:

1. A processing cleaning method, comprising:
   igniting and maintaining a plasma from cleaning gases or vapors delivered to a processing region, the processing region defined by a chamber lid and a substrate support assembly that faces the chamber lid;
   partially elevating a substrate above the substrate support assembly, the substrate support assembly comprising:
      a first portion of dielectric material that forms a substrate supporting surface;
      a first electrode spaced apart from the substrate supporting surface by the first portion of dielectric material;
      an edge ring that surrounds the substrate supporting surface, the edge ring having one or more edge pocket surfaces that define an edge pocket region with a circumferential edge of the partially lifted substrate disposed over the substrate supporting surface; and
      a second electrode spaced apart from the edge ring by a second portion of dielectric material, wherein
   the substrate support assembly is electrically coupled to a radio frequency (RF) generator that delivers an RF signal used to ignite and maintain the plasma,
   the RF signal establishes a first RF waveform at the first electrode and a second RF waveform at the second electrode,
   the second electrode is electrically coupled to an edge tuning circuit that is configured to adjust one or more characteristics of the second RF waveform relative to the first RF waveform to control a plasma density uniformity in the processing region, and
   at least one characteristic of the second RF waveform is different from a characteristic of the first RF waveform; and
   exposing the one or more edge pocket surfaces to the plasma.

2. The method of claim 1, wherein the at least one different characteristic comprises a phase difference between the second RF waveform and the first RF waveform.

3. The method of claim 2, wherein the phase difference between the second RF waveform and the first RF waveform causes an increase in plasma density in the edge pocket region.

4. The method of claim 1, wherein the edge tuning circuit comprises one or more variable capacitors.

5. The method of claim 4, wherein the edge tuning circuit is electrically coupled between the second electrode and ground.

6. The method of claim 4, wherein the edge tuning circuit is electrically coupled between the second electrode and the RF generator.

7. The method of claim 4, wherein the edge tuning circuit is electrically coupled to the second electrode, ground, and an RF generator.

8. The method of claim 1, wherein the substrate support assembly comprises a support base, the RF signal is delivered to the support base, and the first electrode is capacitively coupled to the support base through a second portion of dielectric material disposed between the support base and the first electrode.

9. The method of claim 8, wherein the first electrode is electrically coupled to a first bias generator configured to establish a first pulsed voltage (PV) waveform at the first electrode during substrate processing.

10. The method of claim 9, wherein the second electrode is electrically coupled to a second bias generator configured to establish a second pulsed voltage (PV) waveform at the second electrode during substrate processing.

11. The method of claim 10, further comprising maintaining a voltage established at one or both of the first electrode or edge control electrode at about 0+/−1 volts (V) while concurrently exposing the one or more edge pocket surfaces to the plasma.

12. The method of claim 1, wherein the RF signal has a frequency of about 27 MHz or more.

13. A plasma processing chamber, comprising:
   a chamber body and a chamber lid that define a processing volume;
   a substrate support assembly disposed in the processing volume, the substrate support assembly comprising:
      a support base; and
      a substrate support disposed on the support base, the substrate support comprising a dielectric material that forms a substrate supporting surface, a bias electrode that is disposed in the dielectric material and is spaced apart from the substrate supporting surface and the support base by portions of the dielectric material, and an edge control electrode that is spaced a distance from a center of the bias electrode;
   an edge tuning circuit electrically coupled to the edge control electrode; and
   a non-transitory computer-readable medium having instructions for performing a cleaning method, the method comprising:
      generating, by use of an RF signal delivered to the support base, a plasma from cleaning gases or vapors delivered to the processing volume, wherein the RF signal is delivered to the support base by an RF generator, and the RF signal establishes a first RF waveform at the bias electrode and a second RF waveform at the edge control electrode;
      partially elevating a substrate above the substrate support assembly, wherein an edge pocket region is define along a circumferential edge of the partially lifted substrate; and
      adjusting, by use of the edge tuning circuit, one or more characteristics of the second RF waveform relative to the first RF waveform.

14. The plasma processing chamber of claim 13, wherein (b) comprises adjusting, by use of the edge tuning circuit, one or more of a voltage amplitude ratio, a current amplitude ratio, or a phase difference between the second RF waveform and the first RF waveform.

15. The plasma processing chamber of claim 14, wherein (b) comprises adjusting the phase difference between the second RF waveform and the first RF waveform.

16. The plasma processing chamber of claim 15, wherein adjusting the phase difference between the second RF waveform and the first RF waveform increases a concentration of a plasma formed in a gap region between an edge of the partially lifted substrate and an edge ring disposed on the substrate support.

17. The plasma processing chamber of claim 13, wherein the edge tuning circuit comprises one or more variable capacitors.

18. The plasma processing chamber of claim 13, wherein the edge tuning circuit is electrically coupled between the edge control electrode and ground.

19. The plasma processing chamber of claim 13, wherein the edge tuning circuit is electrically coupled between the edge control electrode and the RF generator.

20. The plasma processing chamber of claim 13, wherein the edge tuning circuit is electrically coupled to the edge control electrode, ground, and the RF generator.

* * * * *